United States Patent
Lo et al.

(10) Patent No.: US 6,601,051 B1
(45) Date of Patent: *Jul. 29, 2003

(54) NEURAL SYSTEMS WITH RANGE REDUCERS AND/OR EXTENDERS

(75) Inventors: James Ting-Ho Lo, Howard County, MD (US); Lei Yu, Sterling, VA (US)

(73) Assignee: Maryland Technology Corporation, Ellicott City, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/893,782

(22) Filed: Jul. 11, 1997

Related U.S. Application Data

(63) Continuation-in-part of application No. 08/104,488, filed on Aug. 9, 1993, now Pat. No. 5,649,065.

(51) Int. Cl.$^7$ .............................................. G06F 15/18
(52) U.S. Cl. ............................ 706/23; 706/22; 706/25; 706/30; 706/31
(58) Field of Search .............................. 706/22, 25, 26, 706/27, 30, 31, 23

(56) References Cited

U.S. PATENT DOCUMENTS

| | | | | |
|---|---|---|---|---|
| 4,937,872 A | * | 6/1990 | Hopfield et al. ............. | 704/232 |
| 5,003,490 A | | 3/1991 | Castelaz et al. ............. | 364/513 |
| 5,150,323 A | | 9/1992 | Castelaz ...................... | 364/807 |
| 5,175,797 A | * | 12/1992 | Funabashi et al. ........... | 706/16 |
| 5,216,750 A | * | 6/1993 | Smith .......................... | 706/18 |
| 5,253,329 A | * | 10/1993 | Villarreal et al. ............ | 706/31 |
| 5,408,424 A | * | 4/1995 | Lo ............................... | 708/303 |
| 5,412,754 A | * | 5/1995 | Le Cun et al. ............... | 706/31 |
| 5,640,494 A | * | 6/1997 | Jabri et al. ................... | 706/25 |
| 5,649,065 A | | 7/1997 | Lo et al. ...................... | 395/23 |

OTHER PUBLICATIONS

Logar et al., "Predicting Acid Concentrations in Processing Plant Effluent: An Application of Time Series Prediction Using Neural Networks," Proceedings of 1992 ACM/SIGAPP Symposium on Applied Computing (vol. 11): Technological Challenges of the 1990's, pp. 651–658, Mar. 1992.*

Mori et al., "A Recurrent Neural Network for Short–Term Load Forecasting," Proceedings of Second International Forum on Applications of Neural Networks to Power Systems, 1993, pp. 395–400, Apr. 1993.*

"How to Forecast Time Series (Temporal Sequences)?" <Retrieved From Internet on May 19, 2000> http://www.faqs.org/faqs/ai-faq/neural-nets/part7/section-4.html, May 2000.*

"Chapter Neural Networks" <Retrieved from Internet on May 10, 2000> http://www.ee.up.ac.za/ee/telecoms/telecentre/nicchapternn.html, May 2000.*

(List continued on next page.)

*Primary Examiner*—George B. Davis

(57) ABSTRACT

A neural system is disclosed for processing an exogenous input process to produce a good outward output process with respect to a performance criterion, even if the range of one or both of these processes is necessarily large and/or keeps necessarily expanding during the operation of the neural system. The disclosed neural system comprises a recurrent neural network (RNN) and at least one range extender or reducer, each of which is a dynamic transformer. A range reducer transforms dynamically at least one component of the exogenous input process into inputs to at least one input neuron of said RNN. A range extender transforms dynamically outputs of at least one output neuron of said RNN into at least one component of the outward output process. There are many types of range extender and reducer, which have different degrees of effectiveness and computational costs. For a neural system under design, the types of range extenders and/or reducers are selected jointly with the architecture of the RNN in consideration of the neural system's processing performance with respect to the mentioned performance criterion, the RNN's size and the computational cost of selected range extenders and reducers so as to maximize the cost effectiveness of the neural system.

20 Claims, 16 Drawing Sheets-

OTHER PUBLICATIONS

Kao et al., "Prediction of Chaotic Time Series Using Recurrent Neural Networks," Proceedings of 1992 IEEE–SP Workshop on Neural Networks for Signal Processing, pp. 436–443, Sep. 1992.*

J. T.–H. Lo and L. Yu, "Overcoming Recurrent Neural Networks' Compactness Limitation for Neurofiltering," *Proceedings of the International Conference on Neural Networks,* vol. 4, pp. 2181–2186 (1997).

K. Narendra and K. Parthasarathy, "Identification and Control of Dynamical System Using Neural Networks," *IEEE Transactions on Neural Networks,* vol. 1, No. 1, pp. 4–27 (1990).

G. Puskorius and L. Feldcamp, "Neurocontrol of Nonlinear Dynamical Systems with Kalman Filter Trained Recurrent Networks," *IEEE Trainsactions on Neural Networks,* vol. 5, No. 2, pp. 279–297 (1994).

O. Nerrand et al, "Neural Networks and Nonlinear Adaptive Filtering: Unifying Concepts and New Algorithms," *Neural Computation,* vol. 5, pp. 165–199 (1993).

J. T.–H. Lo, "Optimal Filtering by Recurrent Neural Networks," in *Procs. of the 30th Annual Allerton Conf. on Comm. Contr., and Comput., Monticello, IL, Oct. 1992,* ed. P. Van Dooren and M. Spong, pp. 903–912 (1992).

J. T.–H. Lo, "Synthetic Approach to Optimal Filtering," *Procs. of the 1992 Intl. Simul. Tech. Conf. and 1992 Workshop on Neural Networks, Clear Lake, Texas, Nov. 1992,* pp. 475–481 (1992).

L. Yin et al, "A New Class of Nonlinear Filters—Neural Filters," *IEEE Transaction on Signal Processing,* vol. 41, pp. 1201–1222 (1993).

* cited by examiner

NEURAL SYSTEMS WITH RANGE REDUCERS AND/OR EXTENDERS

CROSS-REFERENCE TO RELATED APPLICATION

This application is a continuation-in-part of U.S. patent application Ser. No. 08/104,488, entitled "Optimal Filtering by Neural Networks with Range Extenders and/or Reducers," filed Aug. 9, 1993, now U.S. Pat. No. 5,649,065.

STATEMENT OF GOVERNMENT INTEREST

This invention was made in part with United States Government support under contract F30602-91-C-)0033 awarded by the U.S. Air Force. The Government has certain rights in some claims of this invention.

BACKGROUND OF THE INVENTION

This invention is concerned with the use of a recurrent neural network for processing a discretetime process to produce a discrete-time output process with respect to a performance criterion, even if the range of said discrete-time process or said discrete-time output process is necessarily large and/or necessarily keeps expanding in time during the operation of the artificial recurrent neural network. Here the range of a process at a time refers to the set of all possible values of the process up to and including the time. The performance criterion is selected in accordance with the purpose of said processing in such fields as signal/speech processing, system identification/control, communication, robotics, economics, geophysics, sonar/radar data processing, oceanography, time series prediction, financial market forecast, etc.

There are many good books on the applications of recurrent neural networks (e.g., D. A. White and D. A. Sofge, editors, *Handbook of Intelligent Control,* Van Nostrand Reinhold (1992), B. Kosko, editor, *Neural Networks for Signal Processing,* Prentice Hall (1992), D. P. Morgan and C. L. Scofield, *Neural Networks and Speech Processing,* Kluwer Academic Publishers (1991)), and E. Sanchez-Sinencio and C. Lau, editors, *Artificial Neural Networks,* IEEE Press (1992)). There are also a large number of research articles concerning the applications of recurrent neural networks, which can be found in journals (e.g., *IEEE Transactions on Neural Networks, Neural Networks,* and *Neural Computation*), and in Conference proceedings (e.g., *Proceedings of the International Joint Conference on Neural Networks*).

Many patent documents exist concerning the applications of recurrent neural networks (RNNs). Three that seem highly relevant to the present invention are as follows. In U.S. Pat. No. 5,003,490 to P. F. Castelaz and D. E. Mills, (1991), a multilayer perceptron with a sigmoid activation function and a tapped delay line for the input is used to classify input waveforms. In U.S. Pat. No. 5,150,323 (1992) to P. F. Castelaz, a multilayer perceptron with a sigmoid activation function and a couple of tapped delay lines for preprocessed inputs is used for in-band separation of a composite signal into its constituent signals. In U.S. Pat. No. 5,408,424 (1995) to James T. Lo, recurrent neural networks are used for optimal filtering.

There are two fundamental difficulties with applying RNNs (recurrent neural networks): First, when the range of the input process to an RNN or the range of the output process from the RNN is necessarily large as compared with a desirable level of accuracy of the RNN's processing, the numbers of neurons and connections of the RNN, the size of the training data set, and the amount of training computation are usually required to be very large. (We recall that the range of a process at a time is defined to be the set of all possible values of the process up to and including the time.) For instance, if the desired level of accuracy in determining the 3-1-3 Euler angles ($\theta$, $\phi$, $\psi$) of the attitude of a satellite is to within 20 arcseconds, the range of these Euler angles, which is the set $[-180°, 180°)^3$, is relatively large.

Second, if the range of the input process to an RNN or the range of the output process from the RNN keeps growing in time during its operation, the RNN, which has to be trained on a training data set consisting of time series of finite lengths, usually can not generalize beyond these finite lengths of time. For instance, in tracking the positions of airplanes using a Doppler radar system, the distance from the radar system to an airplane may grow, say, from 5 mile to 200 miles in 5000 seconds. If the desired level of tracking accuracy is to within 30 feet and the time series in the training data are 1000 seconds long, an RNN trained on these training data to use the radar measurements to track airplanes is expected not to have the desired level of accuracy after perhaps 1200 seconds.

To eliminate or alleviate these difficulties, a preprocessing of a process before it is input to an RNN or a postprocessing of the output process produced by the RNN is required. We call the process before the preprocessing the exogenous input process, and we call the process immediately after the postprocessing the outward output process in order to distinguish them from the input and output processes of the RNN, which are the processes that are immediately input to and output from the RNN respectively.

A simple and common way to reduce the range of a exogenous input process or to extend the range of its output process is scaling. We may use a squashing function to reduce (or squash) the range of an exogenous input process, and use an antisquashing function to extend (or antisquash) the range of an RNN's output process. However, it has been observed in numerical examples that the scaling methods are usually not effective in overcoming either of the aforementioned two difficulties.

Therefore, an apparatus that is more effective than an RNN and an RNN with a scaling preprocessor and/or postprocessor is needed for processing an exogenous input process to produce a good outward output process with respect to a performance criterion, even if the range of said exogenous input process or that of said outward output process is necessarily large and/or necessarily keeps growing during the operation of said apparatus.

SUMMARY

Recurrent neural networks (RNNs) have been applied in a large number of fields including system identification/control, signal/speech processing, communication, robotics, economics, oceanography, geophysics, radar/sonar data processing, target tracking, sensor fusion, active noise cancellation, and financial market forecast. However, if the range of an exogenous input process or the range of the outward output process of an RNN is necessary large or necessarily expands in time, the sizes required of the RNN and the training data set may be very large, and the training of the RNN may be very difficult, especially if a good processing performance is needed. Furthermore, the resulting RNN may not be able to generalize beyond the finite time interval over which the training data is available.

To overcome these difficulties, an apparatus is disclosed here for processing an exogenous input process to produce a good outward output process with respect to a performance criterion, even if said exogenous input process or outward output process has a large or expanding range. The basic idea is the employment of range extenders and reducers in accordance with the teachings of this invention. Each of these range extenders and range reducers is a dynamic transformer and thus called a dynamic range transformer. While a range reducer transforms dynamically at least one component of an exogenous input process, a range extender transforms dynamically the outputs from at least one output neuron of an RNN.

In accordance with the teachings of the present invention, the mentioned apparatus is a neural system comprising an RNN and at least one dynamic range transformer, which is either a range reducer or a range extender, and at least one weight of said RNN is a nonlinear weight determined in a training of said neural system with respect to a training criterion that is defined to reflect the mentioned performance criterion.

Three types of range extender by estimate addition and two types of range reducer by estimate subtraction are disclosed as example dynamic range transformers. Other types of range extender and reducer are possible. Different range reducers and extenders may have different levels of effectiveness and different levels of computational cost. The selection of range extenders and reducers for a neural system is governed by the trade-off between effectiveness and computational cost.

Formulas for training a neural system comprising an RNN and at least one range reducer or a range extender of the disclosed types are provided in the form of pseudo computer programs.

DESCRIPTION OF THE DRAWINGS

These and other features, aspects and advantages of the present invention will become better understood with regard to the following description, appended claims, and accompanying drawings where:

DESCRIPTION OF PREFERRED EMBODIMENTS

Figure 1:
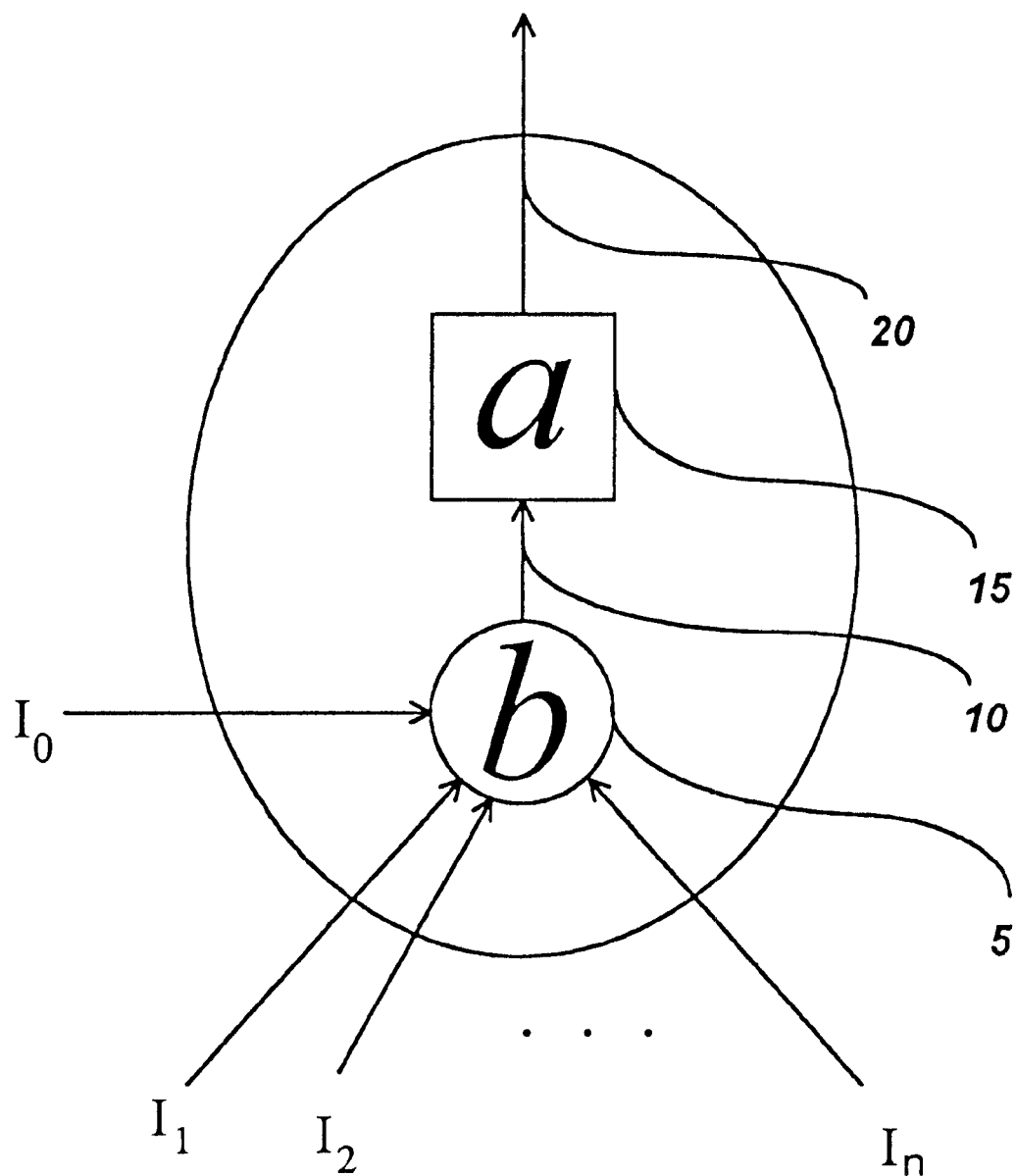
FIG. 1 is a schematic diagram of a typical neuron, which consists of a basis function b and an activation function a, forming a function composition. The basis function 5 is usually a finite series expansion of the bias $I_0$ and inputs, $I_1, \ldots, I_n$, to the neuron, which expansion is comprised of polynomial, rational, trigonometric, exponential, logarithmic, hyperbolic, transcendental, wavelet, and/or spline element(s). The value of the basic function at the link 10 is $b(I_0, I_1, \ldots, I_n)$. The activation function 15 is simply a linear or nonlinear transformation, which is a sigmoidal, exponential, wavelet, spline, polynomial, rational, trigonometric, hyperbolic, logarithmic, other transcendental function or a combination thereof. The activation level 20 of the neuron is thus $a(b(I_0, I_1, \ldots, I_n))$.

Neural systems comprising recurrent neural networks (RNNs) and scaling preprocessors and postprocessors have been used to process an exogenous input process to produce an outward output process with respect to a performance criterion in a large number of fields including system identification/control, signal/speech processing, temporal pattern recognition/generation, communication, time series prediction, robotics, geophysics, oceanography, economics, and financial market forecast. When the range of the exogenous input process or the range of the outward output process is necessarily large relative to a desired level of accuracy or expands necessarily in time, the numbers of neurons and connections of the RNN in such a prior-art neural system and the size of the training data set for training it are usually excessively large to achieve the desired level of accuracy, making training very difficult and running the neural system very inefficient. Moreover, such a prior-art neural system usually can not generalize properly beyond the length of time for which the training data are available.

A neural system in accordance with the teachings of the present invention comprises an RNN and at least one range reducer or a range extender, wherein at least one weight of said RNN is a nonlinear weight determined in a training of said neural system with respect to a training criterion defined to reflect the mentioned performance criterion. As opposed to scaling used in prior-art neural systems, each of these range extenders and range reducers is a dynamic transformer to be defined in the sequel. While a range reducer transforms dynamically at least one component of an exogenous input process, a range extender transforms dynamically outputs of at least one output neuron of said RNN. Range reducers and range extenders are also called dynamic range transformers.

The neural system in accordance with the teachings of the present invention overcomes the foregoing difficulties with the prior-art neural systems. The use of range reducers and/or extenders keeps the numbers of neurons and connections of the RNN in this neural system in accordance with the teachings of the present invention, and the size of the training data set for training it reasonably small for achieving the desired level of accuracy. This neural system generalizes properly beyond the length of time for which the training data are available.

In the following, neural networks are discribed and example neural network paradigms provided. Then two types of range reducer by estimate subtraction and three types of range extender by estimate addition are disclosed as examples of dynamic transformers. Other types of range extender and reducer are possible.

Some terminologies used herein are now defined: A noun in its plural form is sometimes used to encompass both the singular and plural forms of the same noun for brevity. A vector is an n-tuple of real numbers, where n is a positive integer. A scalar is a one dimensional vector. A vector-valued variable is a single-dimensional or a multiple-dimensional variable. A process is an ordered sequence of vector-valued variables with the same dimension. The sequence index is called time and denoted by t and takes on nonnegative integer values $1, 2, \ldots, T$, where T is a finite positive integer or infinity. There may or may not be a mathematical/statistical model for the process, which governs the evolution of the process. There may or may not be any knowledge about the relationship among the components of each vector-valued variable of the process or among the vector-valued variables at different times. A realization of a process is a sequence of the consecutive vector values of the process. If two processes denoted by x(t) and y(t), for $t=1, 2, \ldots, T$, respectively, are related by a known and fixed function $f$ such that $y(t)=f(x(t))$ for $t=1, 2, \ldots, T$, then the function $f$ is called a static transformer of the x process. If y(t) at a current time t depends not only on x(t) but also on at least one preceding value, say x(t−1), of the x process, and possibly on the current and/or preceding value(s) of another process, then the mapping, transversal or recursive, that effects this transformation from the x process to the y process is called a dynamic transformer of the x process.

Neural networks, their elements, their structures and some of their paradigms are defined in the sequel. In this invention disclosure, a neural system is a system comprising a neural network and at least a preprocessor or a postprocessor for the neural network. A process input to a neural system is called an exogenous input process of the neural system. A process produced by a neural system is called an outward output process of the neural system. A preprocessor inputs and processes at least one component of the exogenous input process, and sends said preprocessor's outputs to at least one input neuron of the neural network in the neural system. A postprocessor inputs and processes outputs from at least one output neuron of the neural network in the neural system, and produces at least one component of the outward output process of the same neural system. A range reducer is a dynamic transformer that is a preprocessor in a neural system. A range extender is a dynamic transformer that is a postprocessor in a neural system. A dynamic range transformers is a dynamic transformer that is either a range reducer or a range extender.

Neural Networks and their Elements and Structures

In other words, a range reducer is a preprocessor in a neural system that transforms at least one component of the exogenous input process of said neural system and sends at least one resultant output of said preprocessor to at least one input neuron of a recurrent neural network in said neural system, said at least one resultant output for a current time depending not only on a current value of said at least one component of said exogenous input process for said current time but also on at least one preceding value of said at least one component of said exogenous input process for a preceding time prior to said current time. Similarly, a range extender is a postprocessor in a neural system that transforms an output from at least one output neuron of a recurrent neural network in said neural system and produces at least one component of an outward output process, said at least one component for a current time depending not only on a current value of said output from said at least one output neuron for said current time but also on at least one preceding value of said output from said at least one output neuron for a preceding time prior to said current time.

A neuron or node is a processing element that receives input numbers and produces an output number, which is called the activation level of the neuron or node. Referring to FIG. 1, a typical neuron (or node) consists of two functions, a basis function, b, and an activation function, a, forming a function composition. The basis function 5 is usually a finite series expansion of the bias $I_0$ and inputs, $I_1, \ldots, I_n$, to the neuron, which expansion is comprised of polynomial, rational, trigonometric, exponential, logarithmic, hyperbolic, transcendental, wavelet, and/or spline element(s). The value of the basic function at the link 10 is $b(I_0, I_1, \ldots, I_n)$. The activation function 15 is simply a linear or nonlinear transformation, which is a sigmoidal, exponential, wavelet, spline, polynomial, rational, trigonometric, hyperbolic, logarithmic, other transcendental function or a combination thereof. The activation level 20 of the neuron is thus $a(b(I_0, I_1, \ldots, I_n))$. If the activation level, $a(b(I_0, I_1, \ldots, I_n))$, of a neuron is a nonlinear function of $I_0$, $I_1, \ldots, I_n$, the neuron is called a nonlinear neuron.

Figure 2:
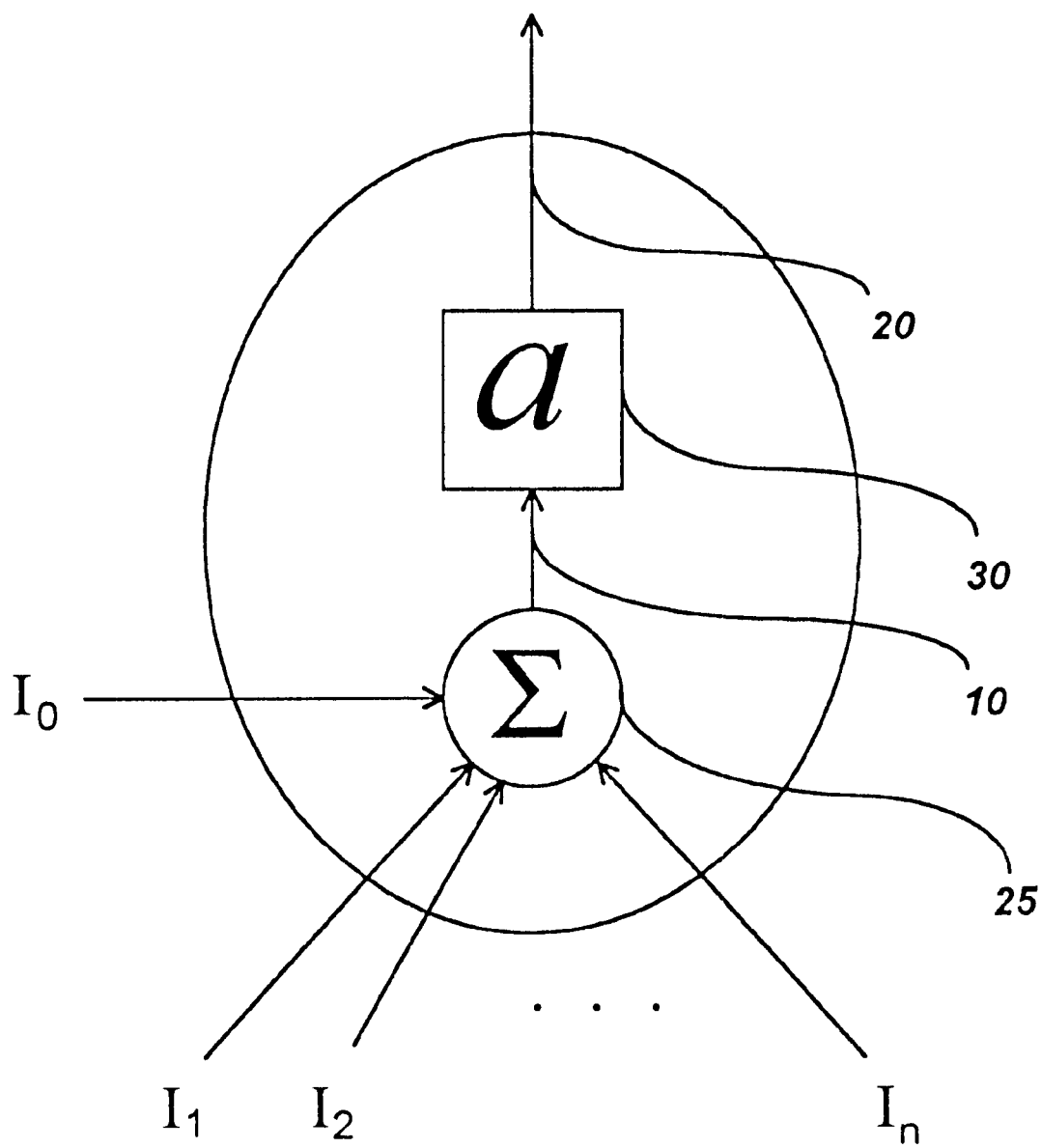
FIG. 2 is a schematic diagram of a widely-used neuron, which is a special case of the typical neuron depicted in FIG. 1. It consists of a summer 25 and an activation function 30 denoted by $\Sigma$ and a respectively. The activation function is a sigmoid function such as the hyperbolic tangent function tan h x, and the logistic function, $1/(1+e^{-x})$. Denoting the inputs to the neuron by $I_1, I_2, \ldots, I_n$, and the bias for the neuron by $I_0$, the basic function here is $\Sigma_{i=0}^n I_i$ and the activation level of the neuron at its output terminal 20 is $a(\Sigma_{i=0}^n I_i)$.

A widely-used neuron, which is a special case of the above typical neuron, is depicted in FIG. 2. It consists of a summer 25 and an activation function 30 denoted by $\Sigma$ and a respectively. The activation function is a sigmoid function such as the hyperbolic tangent function, tan h x, and the logistic function, $1/(1+e^{-x})$. Denoting the inputs to the typical neuron by $I_1, I_2, \ldots, I_n$, and the bias for the neuron by $I_0$, the basic function here is $\Sigma_{i=0}^{n} I_i$ and the activation level of the neuron at its output terminal 20 is $a(\Sigma_{i=0}^{n} I_i)$.

A constant that affects a neuron's processing such as a constant in the basic and activation functions of the neuron is called a parameter or a weight of the neuron. A delayless connection is means for effecting a weighted signal transfer from one neuron to another neuron. More specifically, a delayless connection is means for multiplying the activation level of a neuron by a number, which is called the weight of the delayless connection, and sending the resulting product to another neuron as one input of this neuron. A weight of a delayless connection is sometimes called a delayless weight. A delay connection is means for multiplying a first neuron's activation level by a number, which is called the weight of the delay connection, holding the resulting product for at least one unit of time, and then sending this product to a second neuron as one input of this second neuron. The second neuron may or may not be the same as the first. A weight of a delay connection is sometimes called a delay weight. By a connection and a weight of a connection, we mean a delayless or delay connection and a weight of a delayless or delay connection, respectively, unless indicated or implied otherwise. The bias for a neuron is a parameter of the neuron, but often treated as the weight of a delayless connection leading into this neuron from a constant activation level 1. A (delayless and/or delay) weight may be set equal to one or some other constant. It may also be determined in a process or procedure called training to be elaborated on later. A weight of a neuron and a weight of a connection leading to said neuron are said to be local to said neuron. It is understood that the word "time" herein refers to the index of a sequence, which may be an index of time or may simply be the numbering or index of patterns or events. In the latter case, the phrases, "a time unit" and "a time step" mean "a change of the numbering or index by one."

A neural network (NN) is a plurality of neurons and a plurality of connections (delay and/or delayless connections), which include one or more neurons receiving input signals from outside the NN (neural network), which neuron(s) are called input neurons and one or more neurons sending out output signals to outside the NN, which neuron(s) are called output neurons. An input signal from outside the NN is referred to as an input of the NN. Those neurons that are neither input neurons nor output neurons are called hidden neurons of the NN. A nonlinear neuron that is neither an input neuron nor an output neuron is called a hidden nonlinear neuron. (It is understood that if a neuron in an NN is treated as a hidden neuron in the training of the NN, examining the activation level of a hidden neuron or using it for a purpose other than the purpose that the NN is trained for in an operation of the NN do not make the hidden neuron an output neuron.) There may be one or more different types of neuron in an NN. For instance, an input neuron may only serve to distribute its single exogenous input signal through connections to some other neuron(s) and an output neuron may only serve to evaluate the sum of its bias and input signals, which arrive through connections from other neurons.

Consider an NN whose N neurons each have a summer and an activation function. Let the neurons in the NN be numbered 1 through N; the activation function of neuron n be denoted by $a_n$; the set of neurons each having a connection leading to neuron n with a delay of m time units be denoted by $D_m(n)$; the weight of the connection from neuron j to neuron i be denoted by $w_{ij}$; the activation level of neuron n at time t be denoted by $\beta_n(t)$; the exogenous input to neuron n be denoted by $I_n$; the bias for neuron n be denoted by $w_{n0}$; and the maximum connection delay be denoted by M. Then at time t, the processing performed by neuron n is $$\eta_n(t) = I_n + w_{n0} + \sum_{m=0}^{M} \sum_{j \in D_m(n)} w_{nj} \beta_j(t-m),$$

$$\beta_n(t) = a(\eta_n(t)).$$

Figure 3:
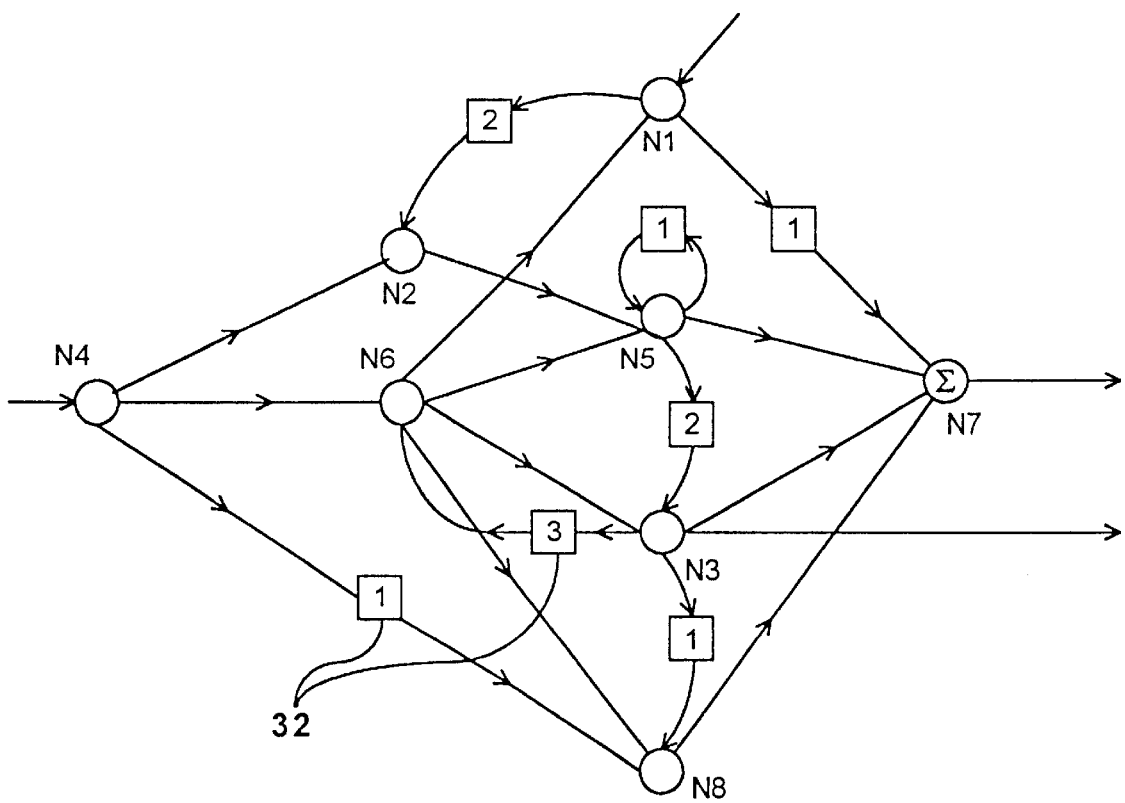
FIG. 3 shows an example neural network (NN). It contains 8 neurons, which are numbered N1 through N8 and represented by circles in the figure. Neurons N1 and N4 are the input neurons receiving exogenous inputs. Neurons N3 and N7 are the output neurons sending out output signals to outside the NN. Both the basic and activation functions of Neuron N4 are the identity function whose input and output are identical. Neuron 4 simply distributes its single input signal to its succeeding neurons N2, N6 and N8. Neuron N7 is simply a summer, which sums the activation levels of N7's preceding neurons N1, N5, N3 and N8. Neurons N1, N2, N3, N5, N6 and N8 are of the same type, whose basic function is a summer and whose activation function is the hyperbolic tangent function, tan h x. A delayless connection is represented by a line with an arrowhead indicating the direction of the signal transfer. A delay connection is represented by two lines with arrowheads connected in series with a box 32 in between. The box encloses a number that indicates the number of time steps that the connection holds a signal before it transfers the signal.

An example NN is shown in FIG. 3. It contains 8 neurons, which are numbered N1 through N8 and represented by circles in the figure. Neurons N1 and N4 are the input neurons receiving exogenous inputs. Neurons N3 and N7 are the output neurons sending out output signals to outside the NN. Both the basic and activation functions of Neuron N4 are the identity function whose input and output are identical. Neuron N4 simply distributes its single input signal to its succeeding neurons N2, N6 and N8. Neuron N7 is simply a summer, which sums the activation levels of N7's preceding neurons N1, N5, N3 and N8. Neurons N1, N2, N3, N5, N6 and N8 are of the same type, whose basic function is a summer and whose activation function is the hyperbolic tangent function, tan h x. A delayless connection is represented by a line with an arrowhead indicating the direction of the signal transfer. A delay connection is represented by two lines, each with an arrowhead, connected in series with a box 32 in between. The box encloses a number that indicates the number of time steps that the connection holds a signal before it transfers the signal.

The example NN has a layer structure: We observe that at a discrete time, neuron N4's activation level must be available, before all the processings in neurons N2 and N6 can be performed. Although N2 and N6 receive signals from N1 and N3 respectively, these signals are delayed signals and are thus available from preceding discrete times. Therefore, as soon as the activation level of N4 becomes available, N2 and N6 can perform their processings and make their activation levels available for other neurons. Similarly, as soon as the activation levels of N2 and N6 become available, the processings of neurons N1, N5, N3 and N8 can be performed, whose activation levels are needed in neuron N7's processing. Hence, the 4 sets of neurons, {N4}, {N2, N6}, {N1, N5, N3, N8}, and {N7} form 4 layers to be called layer 0, layer 1, layer 2, and layer 3, respectively, of the example NN.

This observation can be easily generalized: Given an NN, we ignore the delay connections and examine the order in which the neurons' processings (1) can take place. Those neuron(s) whose processing(s) can be performed simultaneously form a layer. The resulting layers are then numbered layer 0, layer 1, . . . , in their processing order. Notice that a delayless connection must feed forward from a layer to a higher-ordered layer, but a delay connection may either feed forward to a higher-numbered layer or feed back to the same or a lower-numbered layer. A connection is called a feedforward connection or a feedback connection, depending on whether it feeds forward or backward.

Recall from the graph theory that a directed graph G consists of two sets, V and E, V being a finite nonempty set of vertices and E being a set of directed pairs of vertices called edges. An edge is represented by a directed pair $(V_i, V_j)$, where $V_i$ is the tail and $V_j$ is the head of the edge. A path from vertex $V_p$ to vertex $V_q$ in graph G is a sequence of vertices, $V_p, V_{i_1}, V_{i_2}, \ldots, V_{i_n}, V_q$, such that $(V_p, V_{i_1})$ $(V_{i_1}, V_{i_2})$, . . . , and $(V_{i_n}, V_q)$ are edges in E. A simple path is a path in which all vertices except possibly the first and last are distinct. A cycle is a simple path in which the first and last vertices are the same. A very special case of a cycle is a vertex $V_p$, if $(V_p, V_p)$ is an edge in E. The terminology of directed graphs used here can be found in the book by E. Horowitz and S. Sahni, *Fundamentals of Data Structure*, Computer Science Press, Inc. (1976).

Ignoring the exogenous inputs and the connection delays of an NN, the NN can be viewed as a directed graph with the neurons as the vertices and the (delay and/or delayless) connections as the edges. A neuron on a cycle is called a cyclic neuron. A neuron that is not a cyclic neuron is called a noncyclic neuron. All the neuron(s) and connection(s) that have a path to a cyclic neuron form the recursive section of the NN. The rest form the nonrecursive section. Expressing the NN's output(s) as a function of the inputs, the delayed activation levels (held by the delay connections), and the (connection and neuron) weights of the NN, a weight from the nonrecursive section that appears linearly is called a linear weight and a connection with a linear weight is called a linear connection. A weight or connection that is not linear is called a nonlinear weight or connection, respectively. The set of all the linear connection(s), the neuron(s) at the tail(s) of these linear connection(s), and the linear weight(s) of neuron(s) with a linear weight is called the linear section of the NN. The rest of the NN is called the nonlinear section of the NN. The intersection of the nonlinear section and the nonrecursive section is called the nonlinear subsection of the nonrecursive section of the NN.

In the example NN shown in FIG. 3, there are two cycles. One cycle is the sequence, N5, N3, N6 and N5, because (N5, N3), (N3, N6) and (N6, N5) are connections of the NN. The other cycle is N5 itself, since (N5, N5) is a self-feedback connection in the example NN. Hence, N5, N3 and N6 are cyclic neurons. Observe that N6, N1, N2 and N5 form a path to a cyclic neuron, N5; that N4, N2 and N3 form another path to a cyclic neuron, N3; and that N4 and N6 form a third path to a cyclic neuron, N6. Therefore, the neurons, N4, N2, N6, N1, N5 and N3, together with the connections, (N4, N2), (N4, N6), (N2, N5), (N2, N3), (N6, N1), (N6, N5), (N6, N3), (N1, N2), (N5, N3), (N3, N6) and (N5, N5), form the recursive sectioion of the example NN. The neurons, N8 and N7, together with the connections, (N4, N8), (N6, N8), (N3, N8), (N1, N7), N5, N7), (N3, N7) and (N8, N7), form the nonrecursive section of the example NN. Since the activation functions of N1, N5, N3 and N8 are nonlinear, the only linear weights of the example NN are (N1, N7), (N5, N7), (N3, N7) and (N8, N7).

Depending on the structure, there are different types of NN: An NN with at least one delay connection is called a recurrent NN (RNN). An NN without a delay connection is called a nonrecurrent NN. An NN with at least one cyclic neuron is called a recursive NN. An NN without a cyclic neuron is called a nonrecursive NN. While a nonrecursive NN has an empty recursive section, a recursive NN has a nonempty recursive section. We note that a recursive NN must be a recurrent NN, but a recurrent NN may not be a recursive NN. A recurrent NN is a discrete-time dynamic system with all the activation levels of the recurrent NN, that are held by the delay connections at a time, as its dynamic state at the time. The dynamic state of a recurrent NN, in which an operation of the recurrent NN is initiated, is called the Initial dynamic state of the recurrent NN for the operation. The components (or activation levels) of an initial dynamic state of a recurrent NN are viewed as weights of the recurrent NN. By the weights of an NN, we refer to the weights of the connections, the parameters of the neurons, and the components of the initial dynamic state, that exist in the NN.

In this description of preferred embodiments and the appended claims, A neural system is defined to be an RNN (recurrent neural network) together with at least a preprocessor or a postprocessor. A process input to a neural system is called an exogenous input process of the neural system. A process produced by a neural system is called an outward output process of the neural system. A preprocessor inputs and processes at least one component of the exogenous input process, and sends said preprocessor's outputs to at least one input neuron of the NN in the neural system. A postprocessor inputs and processes outputs from at least one output neuron of the NN in the neural system, and produces at least one component of the outward output process of the same neural system. Coefficients of a preprocessor or a postprocessor are also called weights of the preprocessor or the postprocessor.

When a neural system is used for a particular purpose in system identification/control, signal/speech processing, communication, robotics, economics, geophysics, oceanography, sonar/radar data process, financial market forecast/analysis, time series prediction/generation, temporal pattern recognition, etc., a mathematically described measure of how the particular purpose is achieved is called a performance criterion. For instance, if a neural system is used as a time series predictor, its performance criterion is a prediction error criterion. If a neural system is used as a controller for minimizing a control cost function, this control cost function is its performance criterion.

Training a neural system means determining and/or adjusting some or all of the weights of the RNN and its preprocessors and postprocessors of the neural system substantially through a process of reducing the value of a training criterion by the variation of these weights. Here the training criterion is a mathematical function of these weights, that is defined using simulated, experimental, and/ or operational data about the operating environment of the neural system to reflect (i.e. bring about the characteristics of) the performance criterion for a neural system. These data that are used to construct the training criterion are called the training data. Some of the weights of a neural system may be set equal to real numbers including 0 and 1, which are held constant throughout the trainings of the RNN, while the other weights are determined and/or adjusted during trainings. The former weights are called the preset weights and the latter weights are called the weights of trainable weights preset of the neural system. The weights preset weight of a neural system that belong to the RNN therein are called the preset weights of the RNN. The weights (i.e. trainable weights) of the RNN are similarly defined. The totality of the weights (i.e.) trainable weights of the RNN are denoted by w unless specified otherwise. The phrase, "determine and/or adjust," is abbreviated by either "determine" or "adjust." This holds for all tenses of the phrase.

Training a neural system can be performed either online or offline. It is emphasized that the weights of an NS are adjusted only in a training. If there is no online training, the weights are held fixed online.

The collection of all the NNs with some common configurational feature(s) is called an NN paradigm. For instance, the existence or nonexistence of a connection among the neurons in a neuron layer is a configurational feature. The collection of all the NNs of the same NN paradigm that have the same number of neurons of each type, the same number of delay connections, the same number of delayless connections, the same number of input neurons, the same number of output neurons, and the same configuration thereof is called an NN architecture. In other words, two NNs are of the same architecture if and only if they are identical except with possibly different weights on the connections, different parameters in the neurons, and/or different initial dynamic states. Whenever these connection weights, neuron parameters, and/or initial dynamic state are specified for an NN architecture, the NN is completely specified. Recall that these connection weights, neuron parameters and/or initial dynamic state of an NN are all called the weights of the NN, unless a distinction between the connection weights, the neuron parameters, and/or initial dynamic state is necessary and made clear in the context.

Example Neural Network Paradigms

Some example NN paradigms are described in the following.

Figure 4:
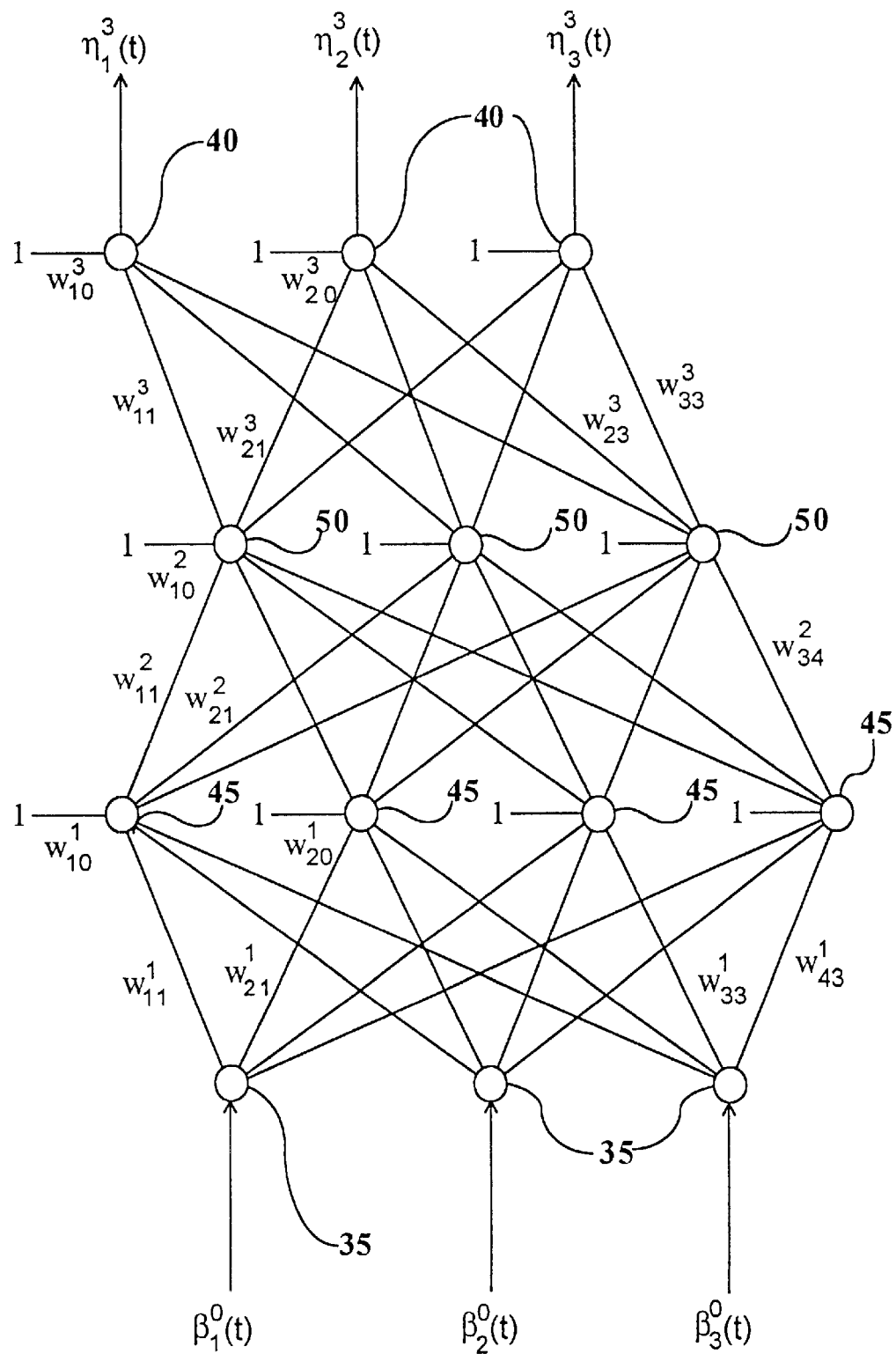
FIG. 4 shows an example multilayer perceptron (MLP). It has 3 input neurons 35 in the zeroth layer, 4 hidden neurons 45 in the first layer, 3 hidden neurons 50 in the second layer, and 3 output neurons 40 in the third and last layer. All the neurons are of the kind shown in FIG. 2. The input neurons 35, whose activation functions are the identity function, simply distribute the exogenous input, $(\beta_1^0(t), \beta_2^0(t), \beta_3^0(t))$, to the neurons in the first layer. The output neurons 40, whose activation functions are also the identity function, are summers, producing outward output, $(\eta_1^3(t), \eta_2^3(t), \eta_3^3(t))$. The activation functions of the neurons in the first and second layers are the hyperbolic tangent, tan h x. All the connections in the example MLP are delayless connection.

1. Multilayer perceptrons (MLPs): MLPs are perhaps the most popular NN paradigm. An example MLP is depicted in FIG. 4. It has 3 input neurons 35 in the zeroth layer, 4 hidden neurons 45 in the first layer, 3 hidden neurons 50 in the second layer, and 3 output neurons 40 in the third and last layer. All the neurons are of the kind shown in FIG. 2. The input neurons 35, whose activation functions are the identity function, simply distribute the exogenous input, $(\beta_1^0(t), \beta_2^0(t), \beta_3^0(t))$, to the neurons in the first layer. The output neurons 40, whose activation functions are also the identity function, are summers, producing outward output, $(\eta_1^3(t), \eta_2^3(t), \eta_3^3(t))$. The activation functions of the neurons in the first and second layers are the hyperbolic tangent, tan h x. All the connections in the example MLP are delayless connection.

The neurons in each layer are numbered from left to right in FIG. 4. The "numbering of a neuron" refers to this numbering in the neuron's layer. The symbol $w_{ij}^l$ denotes the weight on the delayless connection from neuron j in layer l−1 to neuron i in layer l. Only a few of the $w_{ij}^l$ are shown in FIG. 4 to avoid cluttering the figure. The bias for neuron i in layer l is denoted by $w_{ij}^l$, which is viewed as "the weight on the delayless connection leading into i in layer l from neuron 0 in layer l−1, whose activation level is set always equal to 1." Layer l of the MLP consists of the neurons in layer l and the connections leading into them. The totality of the weights in layer l is denoted by $w^l$.

Let us now see how the example MLP depicted in FIG. 4 processes information at time t. Recalling that component i of the input at time t is denoted by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a_i^l(\eta_i^l(t)), \quad (1)$$

$$\eta_i^l(t) = w_{i0}^l + \sum_{j=1}^{n_{l-1}} w_{ij}^l \beta_j^{l-1}(t), \quad (2)$$

where $n_{l-1}$ denotes the number of neurons in layer l-1 and $a_i^l(x)$ is the activation function of neuron i in layer l. The output $\eta_i^L(t)$ for L=3, at output neuron i is then determined by $$\eta_i^L(t) = w_{i0}^L + \sum_{j=1}^{n_L} w_{ij}^L \beta_j^{L-1}(t). \quad (3)$$

Depending on the application, there can be, in an MLP, any number L of layers, any number $n_0$ of input neurons, any number $n_L$ of output neurons, and any number $n_l$ of neurons in each hidden layer l. Although the hyperbolic tangent function tan h x and the logistic function $1/(1+e^{-x})$ are perhaps most widely used as the activation functions in the MLPs in the literature, another function or functions selected from the group consisting of sigmoidal, wavelet, spline, polynomial, rational, trigonometric and exponential functions can also be used as the activation functions $a_i^l$ in MLPs to make the processors in the adaptive neural systems in accordance with the present invention. It is noted that all the MLPs with one and the same activation function for hidden neurons form one MLP paradigm. It will be appreciated that there may be more than one type of activation function in an MLP paradigm and the activation function of an input neuron does not have to be an identity function. By setting some delayless weights $w_{ij}$ equal to zero, differently configured MLPs, which are not fully connected, can be obtained. Notice that the equations, (1), (2) and (3), for l=1, . . . , L-1, possibly with some minor modifications are valid for the processing of most MLPs.

Since there are no delay connections in an MLP, it does not have a recursive section and is thus a nonrecursive NN. If all the output neurons are summers, equation (3) is valid for every output component of an MLP. Hence all the weights, $w_{ij}^L$, in layer L, appear linearly in the MLP's outputs and are thus linear weights of the MLP. Since every other weight appears in the MLP's outputs through nonlinear activation functions, the weights, $w^L$, constitute the linear section of the MLP.

Figure 5:
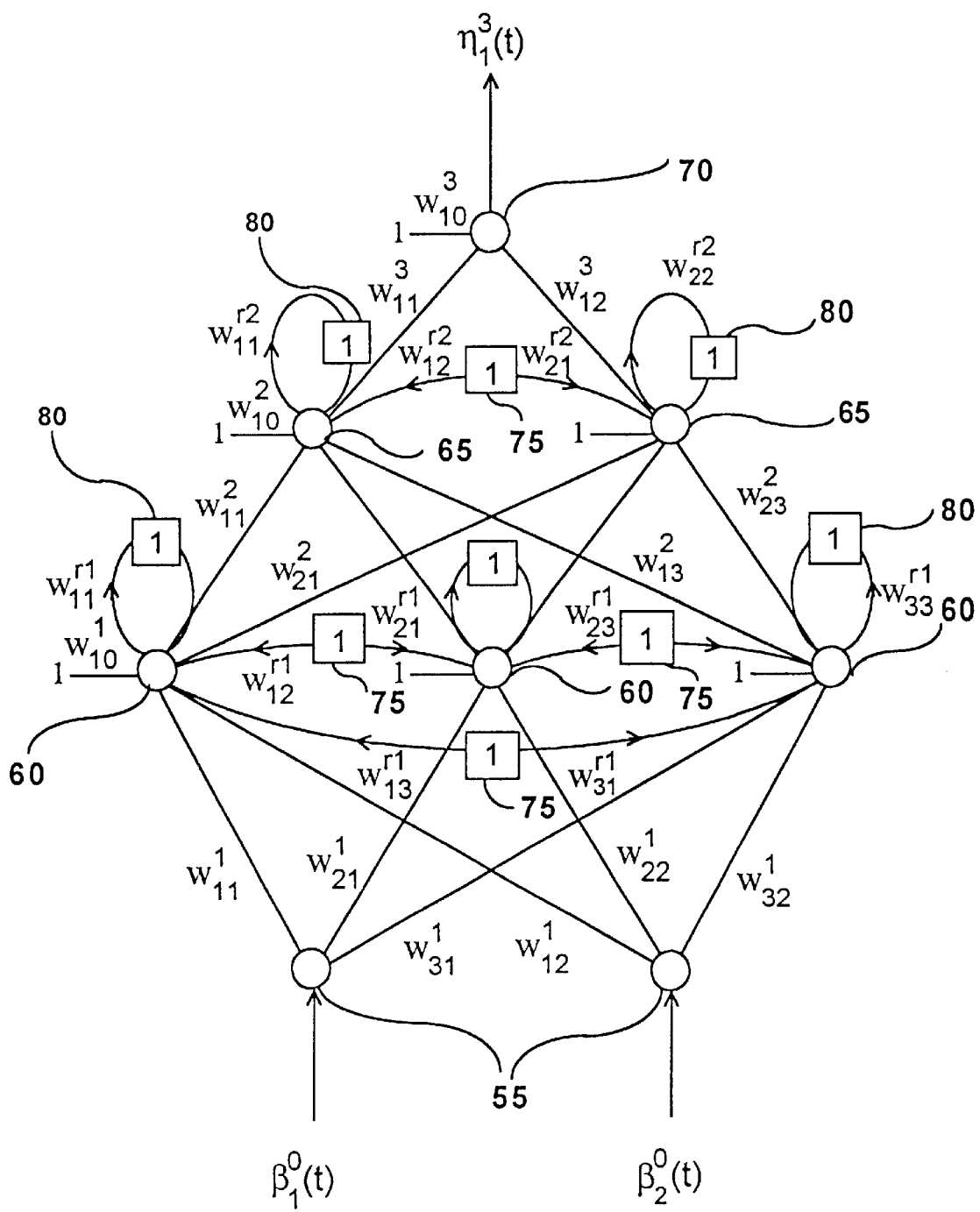
FIG. 5 shows an example multilayer perceptron with interconnected neurons (MLPWIN). It has 2 input neurons 55, 1 output neuron 70, and 2 layers 60, 65 of neurons. The first layer has 3 neurons 60 and the second layer has 2 neurons 65. The input and output neurons are regarded as the neurons in layer 0 and layer 3 respectively. Since the neurons in layers 1 and 2 do not interact directly with outside the MLPWIN, they are hidden neurons and their layers are hidden layers. Every pair of hidden neurons in a layer are interconnected with 2 delay connections, one in each direction. Every delay connection has a unit time delay device. One line with two opposite arrow heads and a box 75 containing the numeral 1 is used to represent such two connections interconnecting two hidden neurons in a layer. All the neurons are of the kind shown in FIG. 2. The input neurons 55, whose activation functions are the identity function, simply distribute the exogenous input, $(\beta_1^0(t), \beta_2^0(t))$, to the neurons in the first layer. The output neuron 70, whose activation functions are also the identity function, are summers, producing outward output, $\eta_1^3(t)$. The activation functions of the neurons in the first and second layers are the hyperbolic tangent, tan h x.

2. Multilayer perceptrons with interconnected neurons (MLPWINs): An MLPWIN is formed from a multilayer perceptron (MLP) by connecting some or all of the neurons in at least one layer of the MLP. There is a unit time delay device on each such connection, making it a delay connection. MLPWINs first appeared in J. L. Elman, "Finding Structures in Time," Cognitive Science, Vol. 14, pp. 179–211 (1990). An example MLPWIN is depicted in FIG. 5. It has 2 input neurons 55, 1 output neuron 70, and 2 layers 60, 65 of neurons. The first layer has 3 neurons 60 and the second layer has 2 neurons 65. The input and output neurons are regarded as the neurons in layer 0 and layer 3 respectively. Since the neurons in layers 1 and 2 do not interact directly with outside the MLPWIN, they are called hidden neurons and their layers are called hidden layers. All the neurons are of the kind shown in FIG. 2. The input neurons 55, whose activation functions are the identity function, simply distribute the exogenous input, $(\beta_1^0(t), \beta_2^0(t))$, to the neurons in the first layer. The output neuron 70, whose activation functions are also the identity function, are summers, producing outward output, $\eta_1^3(t)$. The activation functions of the neurons in the first and second layers are the hyperbolic tangent, tan h x.

The neurons in each layer are numbered from left to right in FIG. 5. The "numbering of a neuron" refers to this numbering in the neuron's layer. The symbol $w_{ij}^l$ denotes the weight on the delayless connection from neuron j in layer l-1 to neuron i in layer l. For notational simplicity, the bias for neuron i in layer l is denoted by $w_{i0}^l$, which is viewed as the "the weight on the delayless connection leading into neuron i in layer l from neuron 0 in layer l-1, the activation level of neuron 0 being set always equal to 1." The symbol $w_{ij}^{rl}$ denotes the weight on the delay connection from neuron j to neuron i in the same layer l. If i≠j, the two delay connections associated with $w_{ij}^{rl}$ and $w_{ji}^{rl}$ between neuron i and neuron j in layer l are indicated in FIG. 5 by the opposite arrow heads on the same line connecting the neurons. The box 80 enclosing the number 1 between the opposite arrow heads denotes a unit time delay device that the weighted activation levels of neuron i and j go through before they are fedback to neurons j and i respectively. The weight for self-feedback of neuron i in layer l is denoted by $w_{ii}^{rl}$. The self-feedback is also delayed by one time unit by a unit time delay device 80 in the FIG. 5. Layer l of the MLPWIN consists of the neurons in layer l and the connections leading into them. The totality of the delay weights, $w_{ij}^{rl}$, in layer l is denoted by $w^{rl}$. The totality of the delayless weights, $w_{ij}^l$, in layer l is denoted by $w^l$.

Figure 6:
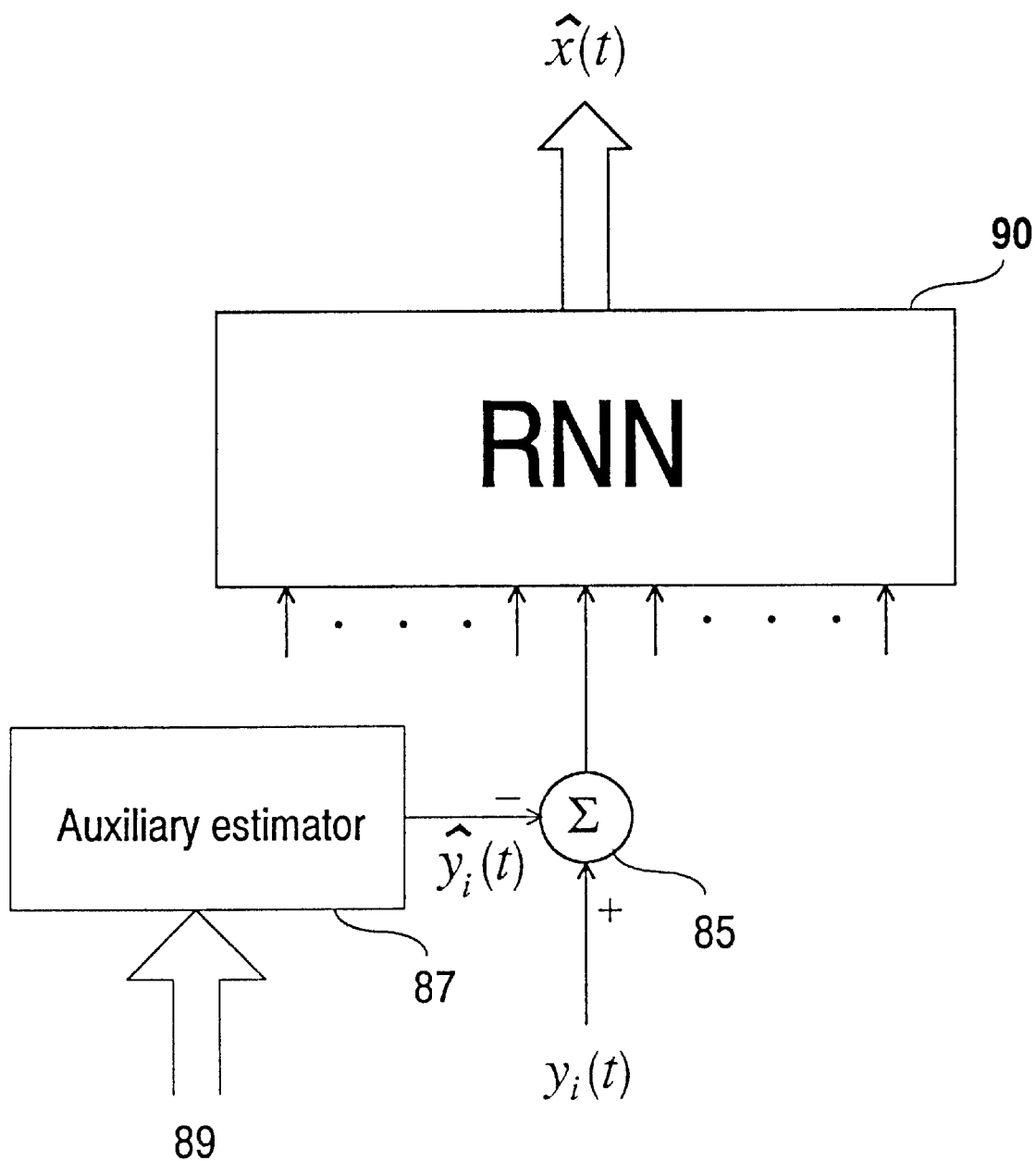
FIG. 6 shows one range reducer by estimate subtraction and how it is connected to a recurrent neural network 90 in a neural system. The range reducer comprises an auxiliary estimator 87 and an subtractor 85. The auxiliary estimator receives inputs 89, and sends an output $\hat{y}_i(t)$ to the subtractor 85, where it is subtracted from the component $y_i(t)$ of the exogenous input process $y(t)$. The difference is then input to the recurrent neural network 90.

Let us now see how the MLPWIN depicted in FIG. 5 processes information at time t. Denoting component i of the input to the MLPWIN at time t by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a_i^l(\eta_i^l(t)) \quad (4)$$

$$\eta_i^l(t) = w_{i0}^l + \sum_{j=1}^{n_{l-1}} w_{ij}^l \beta_j^{l-1}(t) + \sum_{j=1}^{n_l} w_{ij}^{rl} \beta_j^l(t-1), \quad (5)$$

where $n_l$ denotes the number of neurons in layer l, $a_i^l(x)$ is the activation function of neuron i in layer l, and $\beta_i^l(t-1)$, for i=1, 2,, . . . , $n_l$ and l=1, 2, form the dynamic state of the MLPWIN at time t. The dynamic state at time t=1 or at some other time for the performance of the MLPWIN to start being considered is called the initial dynamic state of the MLPWIN. The output $72_1^3(t)$ of the MLPWIN depicted in FIG. 6 is then determined by $$\eta_i^L(t) = w_{i0}^L + \sum_{j=1}^{n_{L-1}} w_{ij}^L \beta_j^{L-1}(t), \quad (6)$$

where L=3, i=1, and $n_{L-1}$=2.

Depending on the application, there can be, in an MLPWIN, any number L of layers, and any number $n_l$ of neurons in each layer l, for l=0, . . . , L. Although only the hyperbolic tangent function tan h x and the logistic function $1/(1+e^{-x})$ have been used as the activation functions in the MLPWINs in the literature, other functions such as any wavelet, spline, polynomial, rational, trigonometric and exponential function can also be used as the activation function in accordance with the present invention to make neural systems. Another activation function worth mentioning here is $x/(1+|x|)$, which was recently proposed in D. L.

Elliott, "A Better Activation Function for Artificial Neural Networks," ISR Technical Report TR 93-8, Institute for Systems Research, University of Maryland, College Park, Md. (1993). It is noted that all the MLPWINs with one and the same activation function for hidden neurons form one MLPWIN paradigm. It will be appreciated that there may be more than one type of activation function in an MLPWIN paradigm and the activation function of an input neuron does not have to be an identity function. By setting some delayless weights $w_{ij}^l$ and/or delay weights $w_{ij}^{rl}$ equal to zero, differently configured MLPWINs can be obtained. Notice that the equations, (4), (5) and (6), for l=1, ..., L−1, with possibly some minor modifications are valid for the processing of most MLPWINs.

In an MLPWIN, a neuron with a self-feedback delay connection and/or in a cycle within a layer is a cyclic neuron. All such cyclic neurons and those neurons and/or connctions that have a path leading to one of these cyclic neurons constitute the recursive section of the MLPWIN. The rest of the neurons and connections of the MLPWIN form the nonrecursive section. If all the output neurons are summers, equation (6) is valid for every output component of the MLPWIN. Hence all the weights, $w_{ij}^L$, in layer L, appear linearly in the MLPWIN's outputs and are thus linear weights of the MLPWIN. If all hidden neurons are nonlinear, every other weight appears in the MLPWIN's outputs through these nonlinear neurons, and hence, the weights, $w_{ij}^L$, constitute the linear section of the MLPWIN.

3. Multilayer perceptrons with output feedbacks (MLPWOFs): An MLPWOF is formed from a multilayer perceptron (MLP) by connecting some or all of its last layer neurons (i.e. the output neurons of the MLP) to some of its zeroth layer neurons (i.e. the input neurons of the MLP). There is a unit time delay device on each such connection. The outputs of an MLPWOF are the processing results of the MLPWOF. They usually enter the training criterion directly and are forced to approach some target (or desired) outputs of the MLPWOF in training.

Those last layer neurons that are connected to some zeroth layer neurons (i.e. the input neurons of the MLP) are called feedback-sending neurons. If a feedback-sending neuron is also an output neuron, it is called an output-feedback-sending neuron. Otherwise, it is called a free-feedbacksending neuron. Similarly, a zeroth layer neuron is called an output-feedback-receiving neuron or a freefeedback-receiving neuron, depending on whether the zeroth layer neuron is connected to an output-feedback-sending or a free-feedback-sending neuron. Those zeroth layer neurons that receive inputs from outside the MLPWOF are called input neurons.

MLPWOFs first appeared in M. I. Jordan, "Attractor Dynamics and Parallelism in a Connectionist Sequential Machine," In *Proceedings of the Eighth Annual Conference of the Cognitive Science Society*, pp. 531–546, Erlbaum (1986). However, in all of the MLPWOFs' applications to system identification/control and signal processing, that can be found in the literature, the feedback-sending neurons of an MLPWOF include all of the output neurons.

Figure 14:
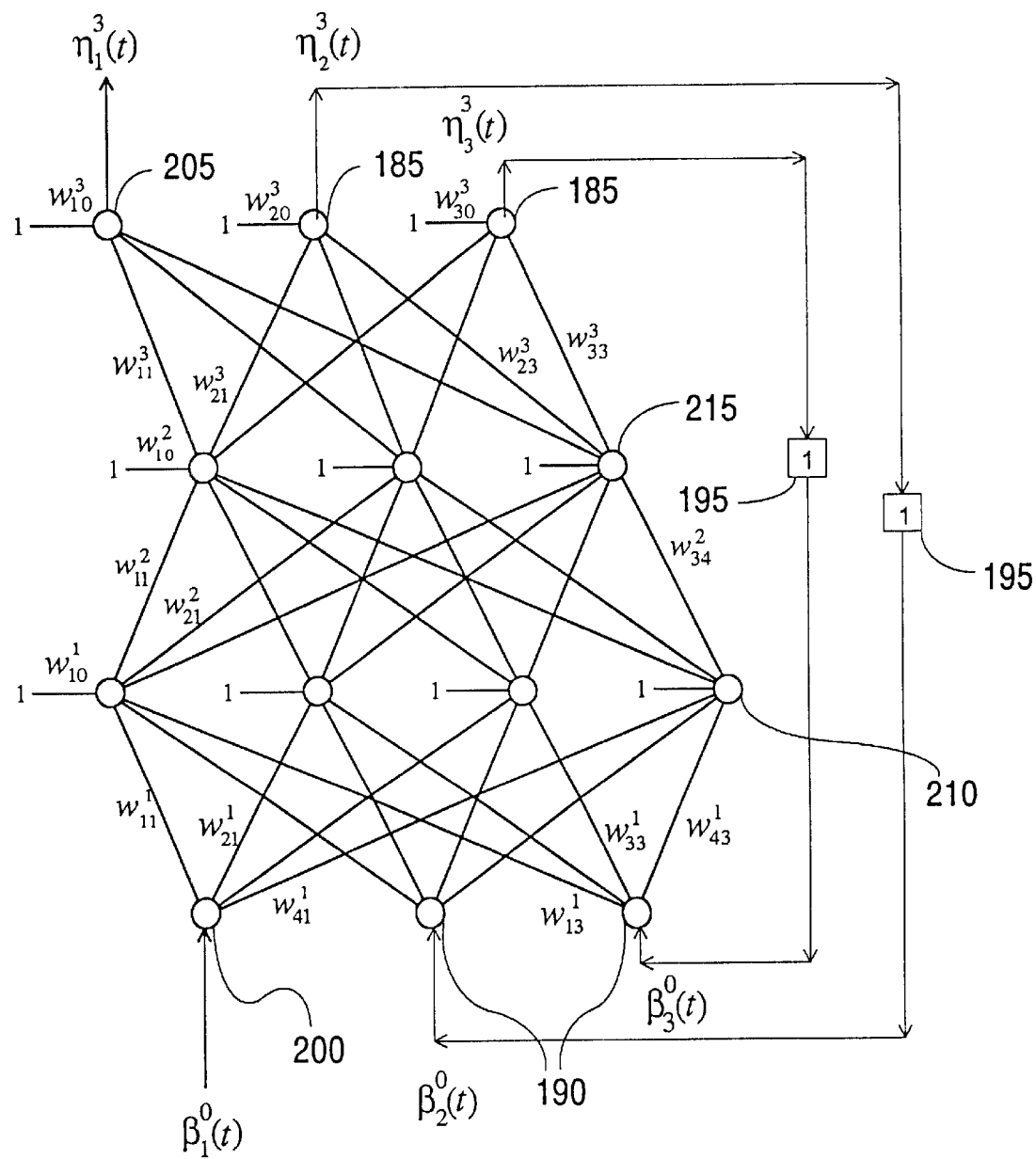
FIG. 14 is a schematic diagram of an example multilayer perceptron with output feedbacks (MLPWOF). The MLPWOF has 2 free-feedback-sending neurons 185 each connected to a free-feedback-receiving neuron 190 through a unit time delay device 195. The free-feedback-sending neurons 185 shown in FIG. 14 are summers. However, free-feedback-sending neurons may also be neurons (or neurons) of another type or types. There is one input neuron 200 in the MLPWOF, which receives input data from outside the network, and one output neuron 205, which sends output data to outside the network.

Preferred MLPWOFs for making neural systems, in accordance with the teaching of this invention, have only free feedbacks. A typical MLPWOF with only free feedbacks is depicted in FIG. 14. The MLPWOF has 2 free-feedback-sending neurons 185 each connected to a free-feedback-receiving neuron 190 through a unit time delay device 195, which is indicated by a solid square as before. The free-feedback-sending neurons 185 shown in FIG. 14 are summers. However, free-feedback-sending neurons may also be neurons (or neurons) of another type or types. There is one input neuron 200 in the MLPWOF, which receives input data from outside the network, and one output neuron 205, which sends output data to outside the network.

Figure 7:
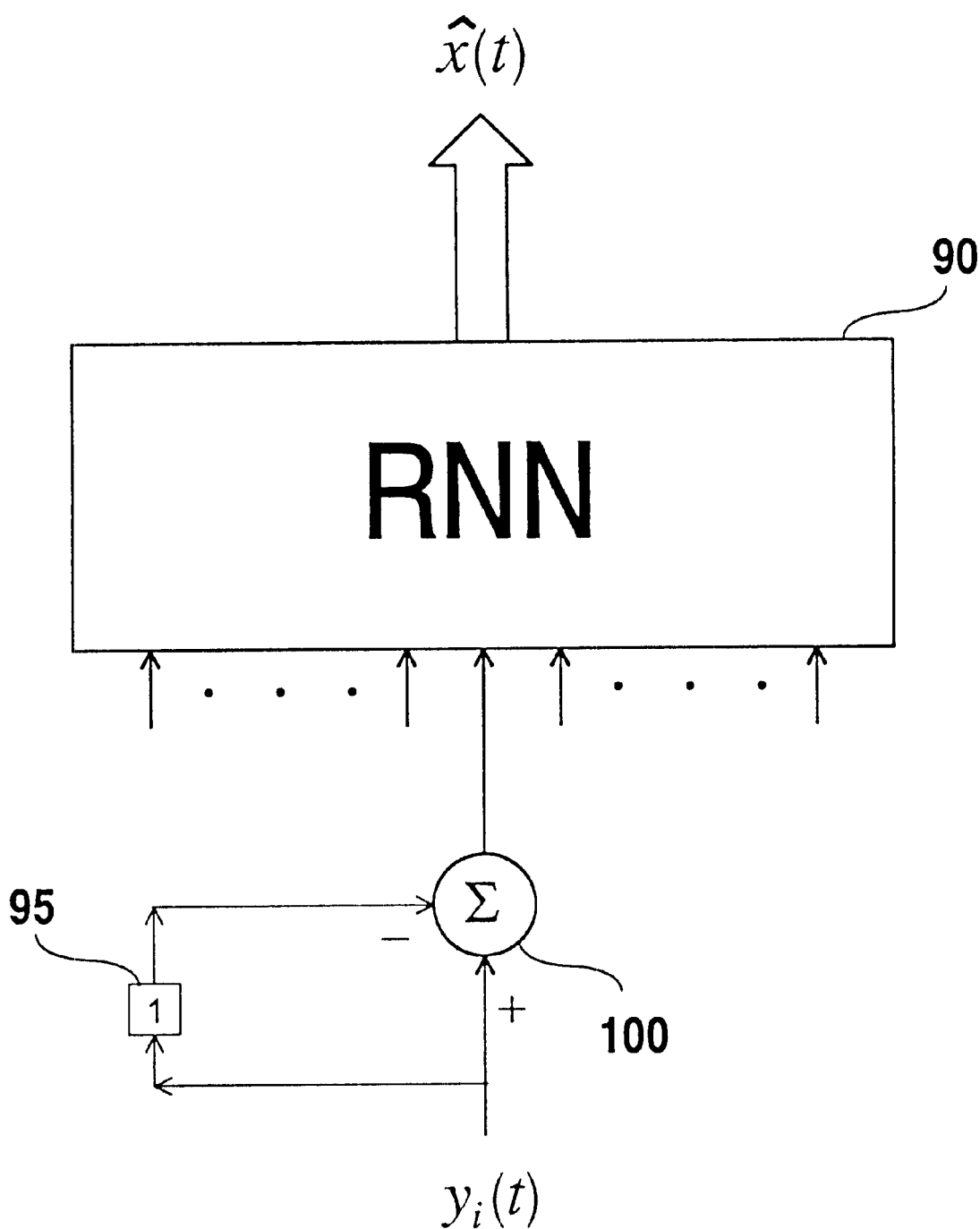
FIG. 7 shows one range reducer by differencing and how it is connected to a recurrent neural network in a neural system. A range reducer by differencing is a range reducer by estimate subtractor, wherein the auxiliary estimator is a unit time delay device 95.

The MLPWOF in FIG. 14 has 4 neurons 210 in the first layer of neurons and 3 neurons 215 in the second layer. The internal function of a neuron in layers 1 and 2 is shown in FIG. 7 and explained previously. In short, the weighted sum 108 in the neuron is $w_0+\Sigma_{i=1}^n w_i I_i$ and the activation level 110 of the neuron is $a(w_0+\Sigma_{i=1}^n w_i I_i)$, where the activation function a(x) is a sigmoid function such as the hyperbolic tangent function tan h x and the logistic function $1/(1+e^{-x})$.

The 3 neurons 190, 200 and 3 neurons 185, 205 are regarded as neurons in layer 0 and layer 3 respectively. The neurons in layers 1 and 2 are regarded as neurons in their respective layers. Since the neurons in layers 1 and 2 do not interact directly with outside the MLPWOF, they are called hidden neurons or neurons, and their layers are called hidden layers. The 3 neurons in layer 0 simply distribute the feedbacks to the neurons in layer 1. Each of the 3 neurons in layer 3 evaluates the weighted sum of the activation levels of the neurons in layer 2. All neurons in each layer are numbered from left to right. An input neuron here can be viewed as a neuron, that has only a single input and whose activation function is the identity function, a(z)=x. An output neuron here can be viewed as a neuron whose activation function is also the identity function. Therefore, the words, "neuron" and "neuron", are interchangeable.

The neurons in each layer are numbered from left to right here. The "numbering of a neuron" refers to this numbering in the neuron's layer. The symbol $w_{ij}^l$ denotes the weight on the delayless connection from neuron j in layer l−1 to neuron i in layer l. Only a few of the $w_{ij}^l$ are shown in FIG. 14 to avoid cluttering the figure. The bias for neuron i in layer l is denoted by $w_{i0}^l$, which is viewed as "the weight on the delayless connection leading into i in layer l from neuron 0 in layer l−1, whose activation level is set always equal to 1."

Let us now see how the MLPWOF depicted in FIG. 14 processes information at time t. Denoting input i at time t by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a(\eta_i^l(t)), \qquad (7)$$

$$\eta_i^l(t) = w_{i0}^l + \sum_{j=1}^{n_{l-1}} w_{ij}^l \beta_j^{l-1}(t) \qquad (8)$$

where $n_{l-1}$ denotes the number of neurons in layer l−1 and a(x) is the activation function. The output $\eta_i^3(t)$ at output terminal i is then determined by $$\eta_i^3(t) = w_{i0}^3 + \sum_{j=1}^{3} w_{ij}^3 \beta_j^2(t). \qquad (9)$$

The feedbacks, $\eta_2^3(t)$ and $\eta_3^3(t)$, are fedback to the feedback-receiving terminals 190 after a unit time delay. Therefore the feedbacks at these terminal, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback-sending neurons 185 at time t=0 form the initial dynamic state of the MLPWOF.

Depending on the application, there can be, in an MLPWOF, any number of input neurons, output neurons, free feedbacks, output feedbacks, and layers, and any number of neurons in each hidden layer. Although only the hyperbolic tangent function tan h x and the logistic function $1/(1+e^{-x})$ have been used as the activation function in the MLPWOFs in the literature, other functions such as any wavelet, spline, polynomial, rational, trigonometric and exponential function can also be used as the activation function, in accordance with the present invention, to make the neural systems. It is noted that all the MLPWOFs with one and the same activation function for hidden neurons form one MLPWOF paradigm. It will be appreciated that there may be more than one type of activation function in an MLPWOF paradigm and the activation function of an input neuron does not have to be an identity function.

Figure 15:
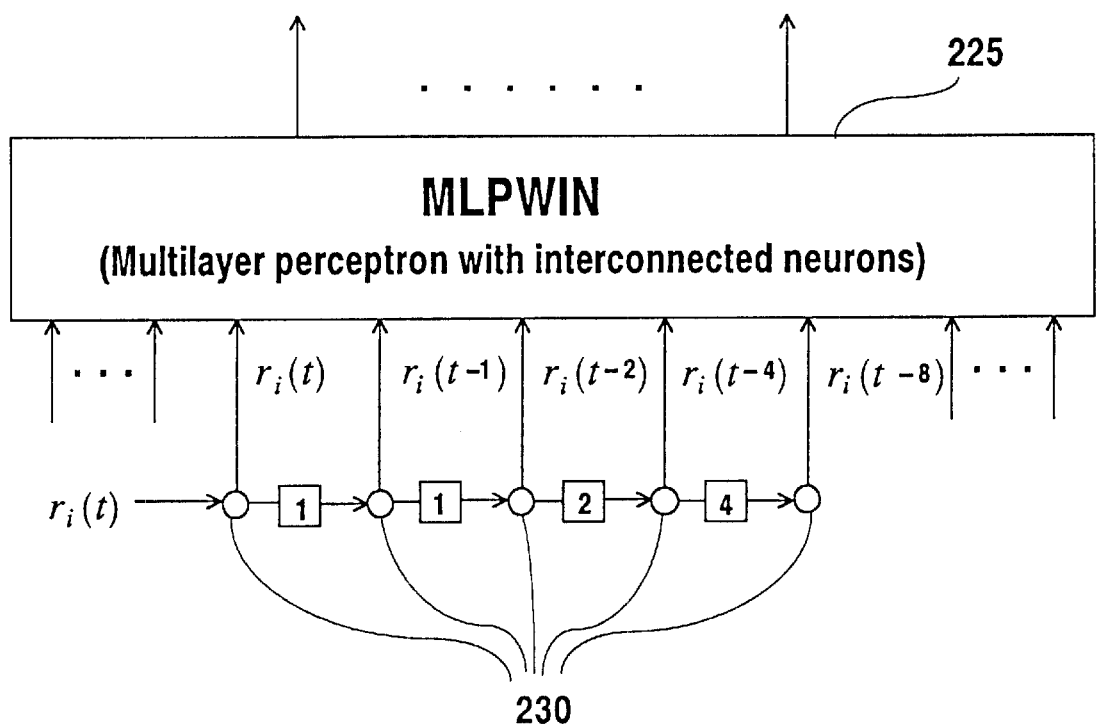
FIG. 15 shows an example multilayer perceptron with interconnected neurons and tapped delay lines (MLPWINTP) with an MLPWIN 225 and one example tapped delay line consisting of five neurons 230 and four delay connections. Each of these five neurons has an identity activation function and simply passes (or distributes) its single input to its outputs. Receiving a component $r_i(t)$ of the input process of the MLPWINTD, the example tapped delay line shown in FIG. 15 holds $r_i(t), r_i(t-1), r_i(t-2), r_i(t-4)$, and $r_i(t-8)$ as input components for the MLPWIN 225 at time t.

4. Multilayer perceptrons with interconnected neurons and tapped delay lines (MLPWINTPs): An MLPWINTP is a neural network formed with an MLPWIN and tapped delay lines. FIG. 15 shows an MLPWIN 225 with one example tapped delay line consisting of five neurons 230 and four delay connections in an example MLPWINTP. Each of these five neurons has an identity activation function and simply passes (or distributes) its single input to its outputs. Receiving a component $r_i(t)$ of the input process of the MLPWINTD, the example tapped delay line shown in FIG. 15 holds $r_i(t)$, $r_i(t-1)$, $r_i(t-2)$, $r_i(t=4)$, and $r_i(t=8)$ as input components for the MLPWIN 225 at time t.

Figure 16:
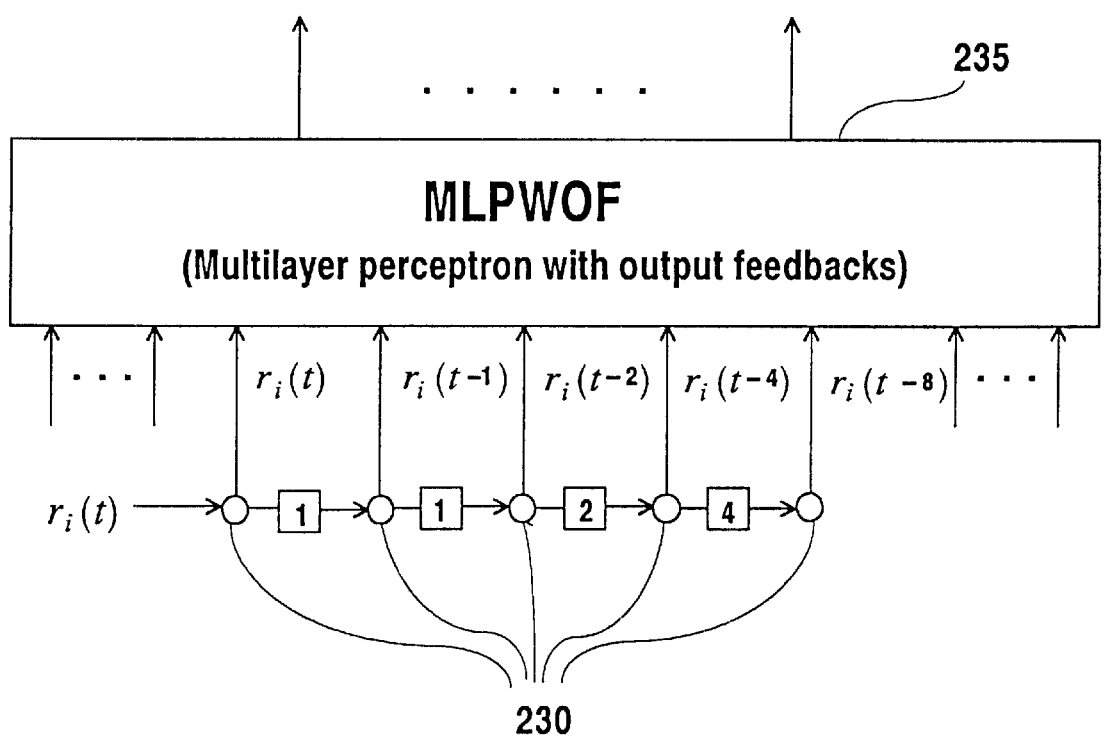
FIG. 16 shows an example multilayer perceptrons with output feedbacks and tapped delay lines (MLPWOFTP) with an MLPWOF 235 and one example tapped delay line consisting of five neurons 230 and four delay connections. Each of these five neurons has an identity activation function and simply passes (or distributes) its single input to its outputs. Receiving a component $r_i(t)$ of the input process of the MLPWOFTD, the example tapped delay line shown in FIG. 16 holds $r_i(t), r_i(t-1), r_i(t-2), r_i(t-4)$, and $r_i(t-8)$ as input components for the MLPWOF 235 at time t. An MLPWOFTD may also have tapped delay lines for holding delayed components of the MLPWOF's output process as input components for the same MLPWOF in the MLPWOFTD.

5. Multilayer perceptrons with output feedbacks and tapped delay lines (MLPWOFTPs): An MLPWOFTP is a neural network formed with an MLPWOF and tapped delay lines. FIG. 16 shows an MLPWOF 235 with one example tapped delay line consisting of five neurons 230 and four delay connections in an example MLPWOFTP. Each of these five neurons has an identity activation function and simply passes (or distributes) its single input to its outputs. Receiving a component $r_i(t)$ of the input process of the MLPWOFTD, the example tapped delay line shown in FIG. 16 holds $r_i(t)$, $r_i(t-1)$, $r_i(t-2)$, $r_i(t-4)$, and $r_i(t-8)$ as input components for the MLPWOF 235 at time t. An MLPWOFTD may also have tapped delay lines for holding delayed components of the MLPWOF's output process as input components for the same MLPWOF in the MLPWOFTD.

6. Radial basis function networks (RBFNs): Radial basis function networks (RBFNs) were first proposed to approximate probability density functions in the 1960s. Only Gaussian activation functions were used then, but numerous other activation functions have been used in a large number of research papers ever since. Nevertheless, all the RBFNs in the literature are neural networks without delay connections and with a single layer of hidden neurons (or processing units).

A typical neuron of an RBFN is depicted in FIG. 1. It is a composition of a basis function 5 and an activation function 15, which are denoted by b and a respectively. If the inputs to the neuron are $I_1, I_2, \ldots, I_n$ as shown in FIG. 1, the basis function 5 with parameters $w_1, w_2, \ldots, w_n$, is usually the Euclidean distance between the vectors $(I_1, I_2, \ldots, I_n)$ and $(w_1, w_2, \ldots, w_n)$, i.e.

$$b(I_1, I_2, \ldots, I_n, w_1, w_2, \ldots, w_n) = \sqrt{\sum_{i=1}^{n}(I_i - w_i)^2},$$

whose value appears at 10. The activation function 15 can be any one of many functions such as the Gaussian function, $$a(x, w_0) = \exp(-x^2/w_0^2),$$

the thin-plate-spline function, $$a(x, w_0) = x^2 \log x,$$

the multiquadric function, $$a(x, w_0) = (x^2 + w_0^2)^{1/2},$$

and the inverse multiquadric function, $$a(x, w_0) = (x^2 + w_0^2)^{-1/2},$$

where $w_0$ is another parameter of the neuron. The activation level of the neuron is its output at 20.

If we replace the MLP neurons with the RBFN neurons in the hidden layers of an MLP (e.g. FIG. 4), we obtain an RBFN. Thus the NNs in FIG. 4 can be viewed as an example RBFN. Here we note that $w_{ij}^l$ denotes a parameter of the i-th neuron in the l-th layer and that the weights on the connections are set equal to one.

Let us now see how the RBFN depicted in FIG. 4 processes information at time t. Denoting component i of the exogenous input at time t by $\beta_i^0(t)$, the activation level $\beta_i^l(t)$ of neuron i in layer l and the basis function output $\eta_i^l(t)$ in the same neuron at time t satisfy, for l=1, 2, $$\beta_i^l(t) = a(\eta_i^l(t), w_{i0}^l) = \exp\left[-(\eta_i^l(t))^2 / (w_{i0}^l)^2\right], \quad (10)$$

$$\eta_i^l(t) = \left[\sum_{j=1}^{n_{l-1}} (\beta_j^{l-1}(t) - w_{ij}^l)^2\right]^{1/2}, \quad (11)$$

where $n_{l-1}$ denotes the number of neurons in layer l-1. The output $\eta_i^3(t)$ at output neuron i is then determined by $$\eta_i^L(t) = w_{i0}^L + \sum_{j=1}^{n_{L-1}} w_{ij}^L \beta_j^{L-1}(t), \quad (12)$$

where L=3, $n_{L-1}$=3, and i=1, 2, 3.

Depending on the application, there can be, in an RBFN, any number L of layers, any number $n_0$ of input neurons, any number $n_L$ of output neurons, and any number $n_l$ of neurons in each hidden layer l. It is noted that all the RBFNs with one and the same activation function for hidden neurons form one RBFN paradigm. It will be appreciated that there may be more than one type of activation function in an RBFN paradigm and the activation function of an input neuron does not have to be an identity function. By setting some delayless weights $w_{ij}$ equal to zero, differently configured RBFNs, which are not fully connected, can be obtained. Notice that the equations, (10), (11) and (12), for l=1, \ldots, L-1, possibly with some minor modifications are valid for the processing of most RBFNs.

Since there are no delay connections in an RBFN, it does not have a recursive section and is thus a nonrecursive NN. If all the output neurons are summers, equation (12) is valid for every output component of an RBFN. Hence all the weights, $w_{ij}^L$, in layer L, appear linearly in the RBFN's outputs and are thus linear weights of the RBFN. Since every other weight appears in the RBFN's outputs through nonlinear activation functions, the weights, $w_{ij}^L$, constitute the linear section of the RBFN.

7. Radial basis function networks with interconnected neurons (RBFNWINs): If we replace the MLPWIN neurons with the RBFN neurons in the hidden layers of an MLPWIN (e.g. FIG. 5) we obtain an RBFNWIN. Let us now see how the example RBFNWIN shown in FIG. 5 processes information at time t. Here we assume that the basis function is the Euclidean distance and the activation function is the Gaussian function. Denoting component i of the input to the RBFNWIN at time t by $\beta_i^0(t)$, the activation level $\beta_i^l(t)$ of neuron i in layer l and the basis function output $\eta_i^l(t)$ in the same neuron at time t satisfy, for l=1, 2, $$\beta_i^l(t) = a(\eta_i^l(t), \omega_{i0}^l) = \exp\left[-(\eta_i^l(t))^2 / (\omega_{i0}^l)^2\right] \quad (13)$$

$$\eta_i^l(t) = \left[\sum_{j=1}^{n_{l-1}} (\beta_j^{l-1}(t) - w_{ij}^l)^2 + \sum_{j=1}^{n_l} (\beta_j^l(t-1) - w_{ij}^{rl})^2\right]^{1/2}, \quad (14)$$

where $n_l$ denotes the number of neurons in layer l, and $\beta_i^l(t=1)$, for i=1, ..., $n_l$ and l=1, 2, form the dynamic state of the example RBFNWIF at time t. The output $\eta_1^3(t)$ of the example RBFNWIN in FIG. 5 is then determined by $$\eta_i^L(t) = w_{i0}^L + \sum_{j=1}^{L} w_{ij}^L \beta_j^{L-1}(t). \quad (15)$$

Depending on the application, there can be, in an RBFNWIN, any number L of layers, and any number $n_l$ of neurons in each layer l, for l=0, ..., L. It is noted that all the RBFNWINs with one and the same activation function for hidden neurons form one RBFNWIN paradigm. It will be appreciated that there may be more than one type of activation function in an RBFNWIN paradigm and the activation function of an input neuron does not have to be an identity function. By setting some delayless weights $w_{ij}^l$ and/or delay weights $w_{ij}^{rl}$ equal to zero, differently configured RBFNWINs can be obtained. Notice that the equations, (13), (14) and (15), for l=1, ..., L-1, with possibly some minor modifications are valid for the processing of most RBFNWINs.

In an RBFNWIN, a neuron with a self-feedback delay connection and/or in a cycle within a layer is a cyclic neuron. All such cyclic neurons and those neurons and/or connctions that have a path leading to one of these cyclic neurons constitute the recursive section of the RBFNWIN. The rest of the neurons and connections of the RBFNWIN form the nonrecursive section. If all the output neurons are summers, equation (6) is valid for every output component of the RBFNWIN. Hence all the weights, $w_{ij}^L$, in layer L, appear linearly in the RBFNWIN's outputs and are thus linear weights of the RBFNWIN. Since every other weight appears in the RBFNWIN's outputs through nonlinear activation functions, the weights, $w_{ij}^L$, constitute the linear section of the RBFNWIN.

Range Reducers Used to Construct Neural Systems

A range reducer in a neural system is a preprocessor of the RNN in the same neural system, that is a dynamic transformer. It dynamically transforms at least one component of the exogenous input process of the neural system and sends the resulting process to at least one input neuron of the RNN in the neural system. A possible benefit of using a range reducer is a reduction of the valid input range and/or approximation capability required of the RNN so as to ease the RNN size and training data requirements and thereby lessen the training difficulty. Another possible benefit is an enhancement of the generalization capability of the neural system beyond the length of time for which the training data are available.

A basic scheme for dynamically transforming the ith component $y_i(t)$ of an exogenous input process $y(t)$ to a neural system is to subtract some estimate $\hat{y}_i(t)$ of $y_i(t)$ from $y_i(t)$ at every time point t. A scheme that generates the estimate $\hat{y}_i(t)$ is called an auxiliary estimator of $y_i(t)$. The resulting difference, $y_i(t)-\hat{y}_i(t)$, is used at time t as the ith component of the input vector to the RNN in the neural system. A device that comprises an auxilliary estimator to generate an estimate $\hat{y}_i(t)$, and a subtractor to perform the subtraction, $y_i(t)-\hat{y}_i(t)$, is called a range reducer by estimate subtraction, which is a dynamic transformer of $y_i(t)$. FIG. 6 shows how a range reducer by estimate subtraction comprising an auxiliary estimator 87 and a subtractor 85 is connected to an RNN 90. The input 89 to the auxiliary estimator at a time can be any information available at the same time during the auxiliary estimator's operation.

It has been found that if all the range reducers in a neural system are range reducers by estimate subtraction and all the auxiliary estimates $\hat{y}_i(t)$ involved at the time point t are functions of the measurement process $y(t)$ up to and including the time point t-1, for t=1, 2, ..., T, then the exogenous input process to the neural system, and the input process to the RNN in the neural system are causally equivalent with respect to the RNN, provided that the RNN is a recursive neural network with a sufficient number of delay connections and the range reducers are properly initialized for an operation. Here causal equivalence of two processes with respect to the RNN means that the values of any one of them at a time can be constructed, with the aid of the RNN, from all the values of the other up to and including the same time. The causal equivalence between the exogenous input process to the neural system and the input process to the RNN guarantees that the range reducers used in the neural system do not "destroy" any useful information contained in the exogenous input process. Two types of range reducer by estimate subtraction are given as examples in the following:

1. Range Reducers by Differencing

If an exogenous input process y is the sampled values, at discrete time points, of a continuous continuous-time process, then the vector value y(t-1) is a "reasonably good" estimate of the vector value y(t). This observation motivated a simple, yet effective way to reduce the range of the measurements, when two consecutive measurements, y(t-1) and y(t), are not too far apart.

Consider the neural system depicted in FIG. 7. A differencer, that consists of a unit time delay 95 and a subtractor 100, is concatenated at a input terminal of an RNN. At each time point t, the differencer subtracts the preceding measurement $y_i(t-1)$ from the current measurement $y_i(t)$ and feeds the difference $y_i(t)-y_i(t-1)$ to the ith input terminal of the RNN. This differencer is a range reducer by estimate subtraction, in which the unit time delay 95 is used as an auxiliary estimator.

There are three ways to initialize the differencer for an operation. One way is to start the neural system at t=2, the ith component of the first input vector to the RNN being $y_i(2)-y_i(1)$ and the first output vector of the RNN being x(2). The second way is to determine an initialization value for $y_i(0)$ jointly with the weights w and initial dynamic state v of the RNN in training. In the operation of the neural system, the ith component of the first input vector to the RNN is $y_i(1)-y_i(0)$. The third way is to use the best available estimate $\bar{y}_i(0)$ of $y_i(0)$ and then use $y_i(1)-\bar{y}_i(0)$ as the ith component of the first input vector to the RNN consistently in the training and operation of the neural system.

2. Range Reducers by Linear Prediction

Figure 8:
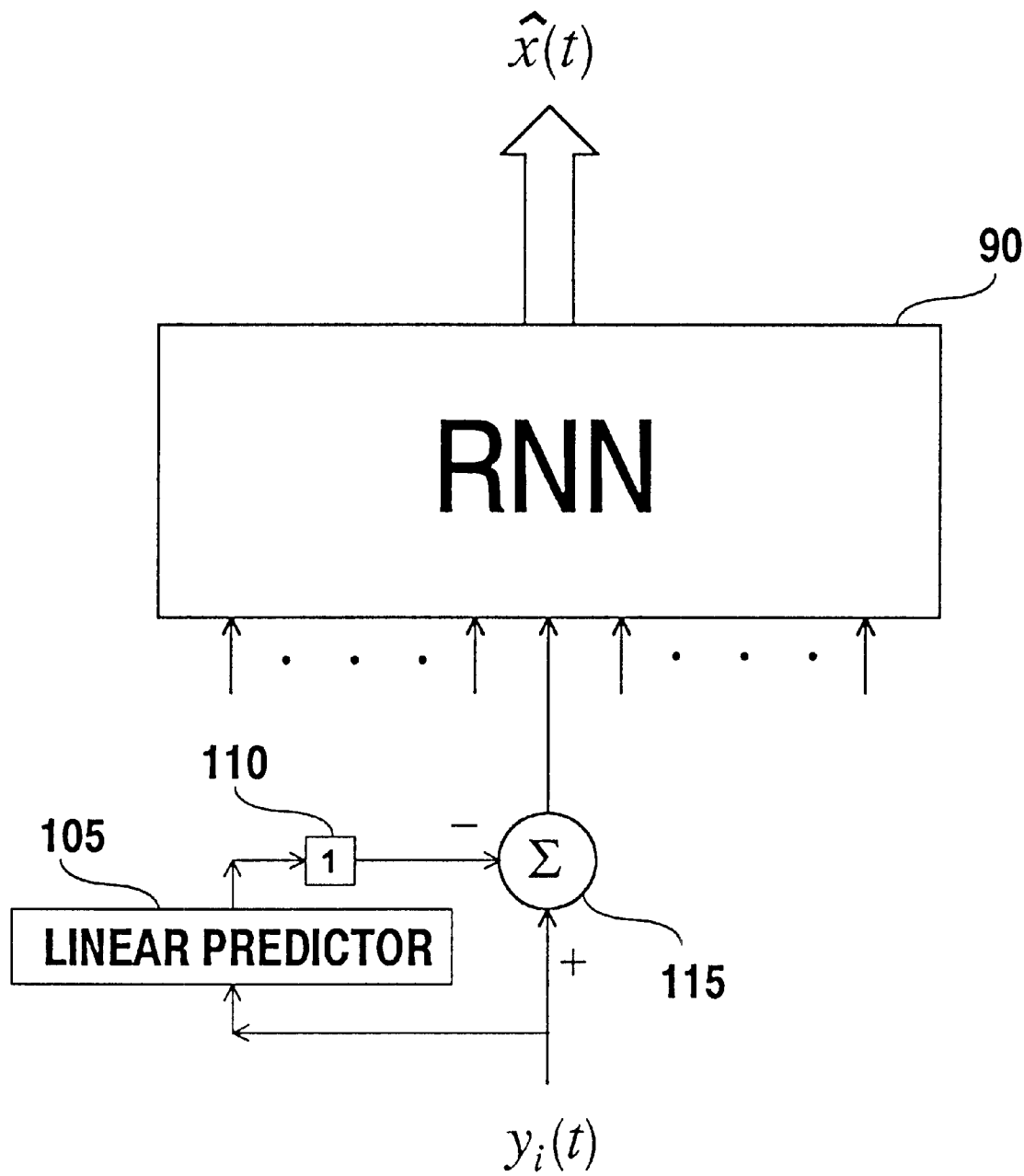
FIG. 8 shows one range reducer by linear prediction and how it is connected to a recurrent neural network in a neural system. A range reducer by linear prediction is a range reducer by estimate subtractor, wherein the auxiliary estimator is a linear predictor 105 and a unit time delay device 110.

Consider the neural system depicted in FIG. 8 where one range reducer is shown. The range reducer, which comprises a linear predictor 105, a unit time delay device 110 and a subtractor 115, is concatenated to the ith input terminal of an RNN 90. The linear predictor inputs the ith component of the exogenous input process y(t) to the neural system, and outputs a prediction $\hat{y}_i(t+1)$ of $y_i(t+1)$. After a unit time delay, the preceding prediction $\hat{y}_i(t)$ is now subtracted from $y_i(t)$ by the subtractor 115. The resulting difference, $y_i(t)-\hat{y}_i(t)$, is then input to the RNN at its ith input neuron.

A range reducer by differencing is obviously a special range reducer by linear prediction, in which the estimate $\hat{y}_i(t+1)$ generated by the linear predictor is simply $y_i(t)$. A general linear predictor is written as $\hat{y}_i(t)=\Sigma_{j=1}^{J} c_j y_i(t-j)$, where J is a fixed positive integer called the order of the linear predictor, and $c_j$ are the linear predictor coefficients (S. Haykin, *Adaptive Filter Theory*, 2nd edition, Prentice-Hall (1991)). Realizations of the ith component $y_i(t)$ of the exogenous input process, which are part of the training data, are used to determine $c_j$, $j=1, 2, \ldots, J$ so that the linear predictor, $\hat{y}_i(t)=\Sigma_{j=1}^{J} c_j y_i(t-j)$, predicts $y_i(t)$ in the standard least-squares sense. A fast and stable algorithm for this can be found in D. T. M. Slock and T. Kailath, "Numerically Stable Fast Transversal Filters for Recursive Least Squares Adaptive Filtering," *IEEE Transactions Signal Processing*, Vol. 39, No. 1, pp. 92–114 (1991). Some other algorithms can be found in S. Haykin, *Adaptive Filter Theory*, 2nd edition, Prentice-Hall (1991).

There are three ways to initialize the linear predictor. One way is to start the neural system at $t=J+1$, the ith component of the first input vector to the RNN being $y_i(J+1)-\hat{y}_i(J+1)$ and the first output vector of the RNN being $\hat{x}(J+1)$. The second way is to determine J initialization values, $y_i(-J+1)$, $y_i(-J+2), \ldots, y_i(0)$ jointly with the weights w and initial dynamic state v of the RNN in training. The third way is to use the best available estimate $\bar{y}_i(-J+1), \bar{y}_i(-J+2), \ldots, \bar{y}_i(0)$ of $y_i(-J+1), y_i(-J+2), \ldots, y_i(0)$ and then use $y_i(1)-\Sigma_{j=1}^{J} c_j \bar{y}_i(1-j)$ as the ith component of the first input vector to the RNN consistently in the training and operation of the neural system.

It will be appreciated that the above arguments can be easily generalized to the vector case in which a linear predictor generates a vector-valued estimate of a certain number of components of y(t), of which estimate a selected number of components are then subtracted from their corresponding components of y(t) to yield their corresponding components of the input vector to the RNN.

Range Extenders Used to Construct Neural Systems

A range extender in a neural system is a postprocessor of the RNN in the same neural system that is a dynamic transformer. It dynamically transforms the outputs from at least one output neuron of the RNN into at least one component of the outward output process of the neural system. A possible benefit of using a range extender is the reduction of the valid output range and/or approximation capability required of the RNN so as to ease the RNN size and training data requirements and thereby lessen the training difficulty. Another possible benefit is an enhancement of the generalization capability of the neural system beyond the length of time for which the training data are available.

A basic scheme for dynamically transforming the outputs of an output neuron, say neuron i in layer L, of an RNN into ith component of the outward output process is to add some estimate $\hat{x}_i(t)$ of a desired outward output $x_i(t)$ for the same output neuron to the neuron's actual output $\beta_i^L(t)$ at every time point t. The resulting sum, $\beta_i^L(t)+\hat{x}_i(t)$, is used as the ith component $\hat{x}_i(t)$ of the outward output vector $\hat{x}(t)$ of the neural system at time t. Thus, the "actual desired output" for the output neuron is $x_i(t)-\hat{x}_i(t)$ at time t. The estimate $\hat{x}_i(t)$ is called an auxiliary estimate of $x_i(t)$ and a scheme that generates this estimate $\hat{x}_i(t)$ is called an auxiliary estimator. A device that comprises such an auxiliary estimator and an adder is called range extender by estimate addition, which is a dynamic transformer of the output process $\beta_i^L(t)$.

Note that realizations of an optimal outward output process may or may not be available for training the neural system. For instance, if a neural system is intended to be a system identifier, communication channel equalizer, time series predictor, or optimal filter, realizations of the desired outward output process of the neural system may be obtained by experiments and/or simulations. However, if a neural system is intended to be a controller of a plant for optimal control or model reference control, realizations of the desired outward output process of the neural system are usually not available.

Figure 9:
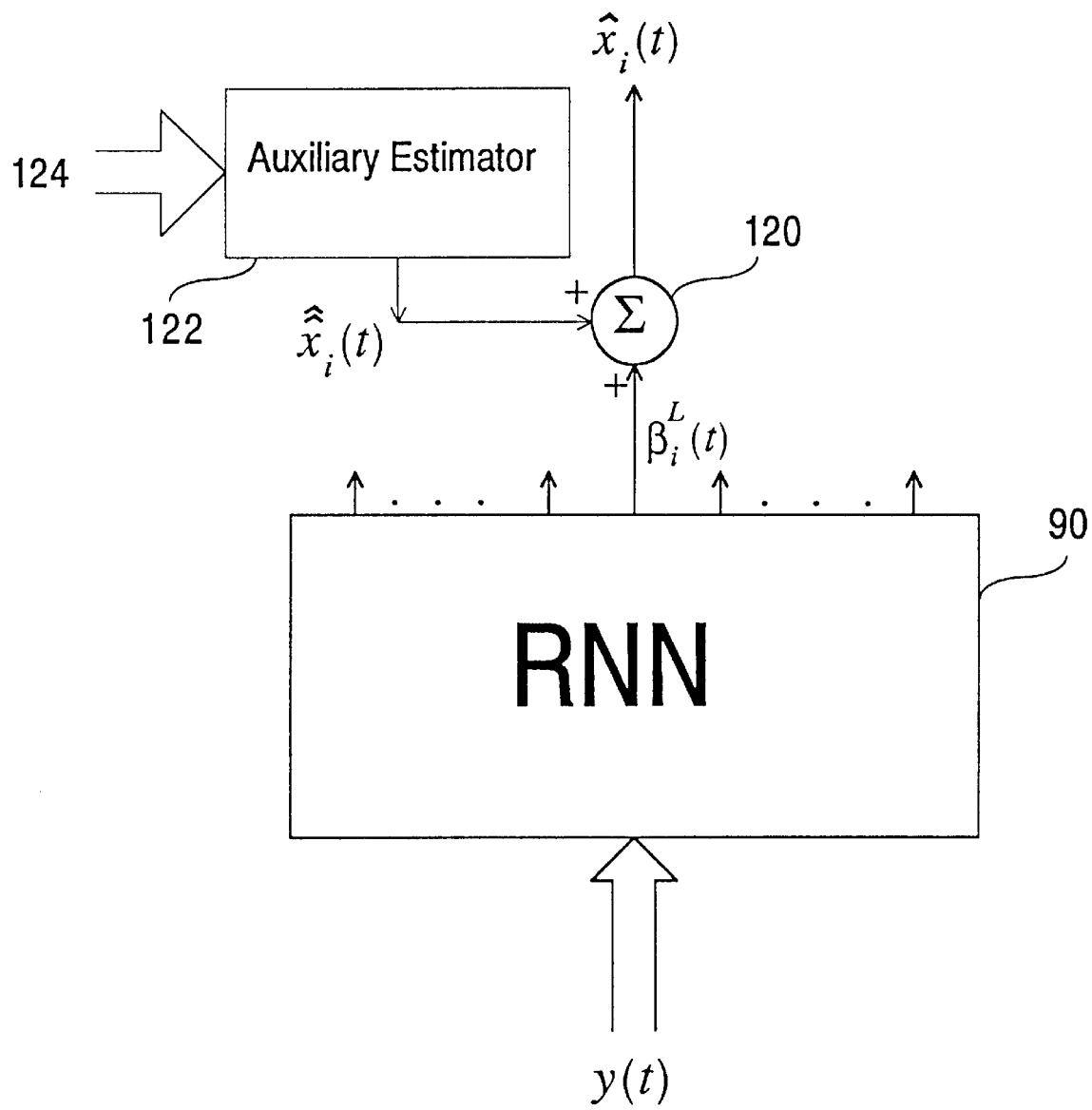
FIG. 9 shows one range extender by estimate addition and how it is connected to a recurrent neural network 90 in a neural system. The range extender comprises an auxiliary estimator 122 and an adder 120. The auxiliary estimator receives inputs 124, and sends an output $\hat{x}_i(t)$ to the adder 120, where it is added to the component $\beta_i^L(t)$ of the outward output process. The sum is the component $\hat{x}_i(t)$ of the outward output process $\hat{x}(t)$ of the neural system.

FIG. 9 shows how a range extender by estimate addition comprising an auxiliary estimator 122 and an adder 120 is connected to an RNN 90. The input 124 to the auxiliary estimator at a time can be any information available at the same time during the auxiliary estimator's operation.

It has been found that a range extender by estimate addition works very effectively, if the auxiliary estimate $\hat{x}_i(t)$ involved is a function of the measurements, $y(\tau), \tau=1, 2, \ldots, t$, for $t=1, 2, \ldots, T$. Three types of range extender by estimate addition, whose auxiliary estimators have different levels of estimation accuracy and different levels of computational cost, are given as examples in the following:

1. Range Extenders by Accumulation

If it is known that the ith component $x_i(t)$ of an optimal outward output process x(t) does not vary very rapidly in time, then the value $x_i(t-1)$ is a good approximate of $x_i(t)$, and a good estimate of $x(t-1)$ is a "reasonably good" estimate of the vector value x(t). This observation motivated a simple, yet effective way to dynamically transform the outputs of an output neuron of an RNN in a neural system, when two consecutive signals, $x(t-1)$ and $x(t)$, are not too far apart.

Figure 10:
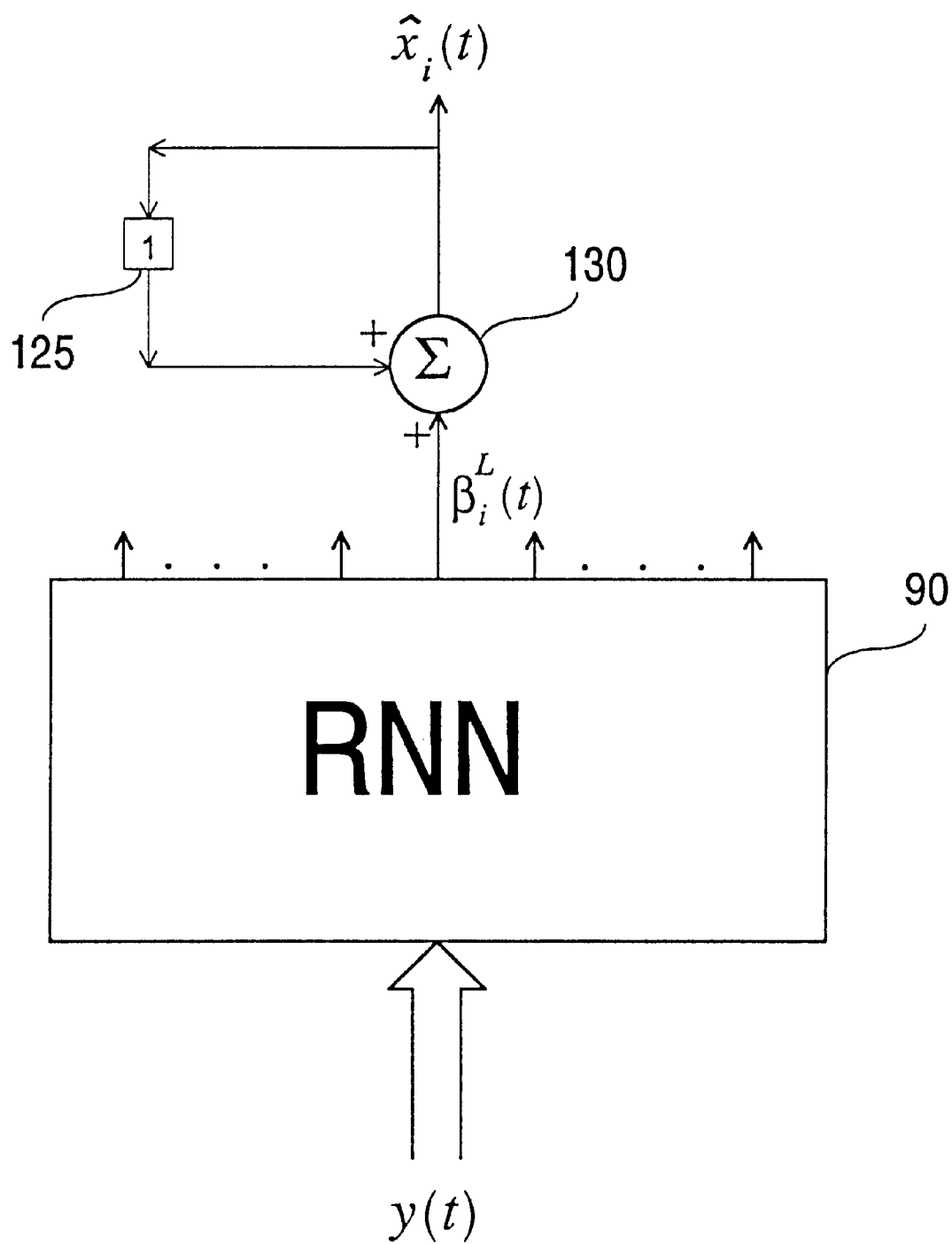
FIG. 10 shows one range extender by accumulation and how it is connected to a recurrent neural network in a neural system. A range extender by accumulation is a range extender by estimate addition, wherein the auxiliary estimator is an unit time delay device 125.

Consider the neural system depicted in FIG. 10. Only one accumulator used as a range extender is shown. The accumulator, comprising a unit time delay device 125 and an adder 130, is concatenated directly to output neuron i of the RNN 90. At each time point t, the accumulator adds the output $\beta_i^L(t)$ of the RNN to the accumulator's output $\hat{x}_i(t-1)$ at the preceding time point t−1. Thus the accumulator accumulates all the outputs of output neuron i of the RNN from $t=1$ onward plus the initial accumulation denoted by $\hat{x}_i(0)$. Mathematically, the accumulator is described simply by $$\hat{x}_i(t)=\beta_i^L(t)+\hat{x}_i(t-1),\ t=1, 2, \ldots, T. \qquad (16)$$

Here, the RNN actually estimates the difference $x_i(t)-\hat{x}_i(t-1)$. If a good a priori estimate $\hat{x}_i(0)$ is given of $x_i(0)$, it should be used as the initial accumulation $\hat{x}_i(0)$. Otherwise, the initial accumulation $\hat{x}_i(0)$ can be determined together with the weights and/or parameters w and the initial dynamic state v of the RNN in training the neural system. Training algorithms are provided in the sequel for training an MLPWIN and an MLPWOF as the RNN together with selected accumulators in the neural system.

An accumulator used as a range extender will be called a range extender by accumulation, which may be used whether realizations of the desired outward output process of the neural system are available for training it or not.

2. Range Extenders by Linear Prediction

Figure 11:
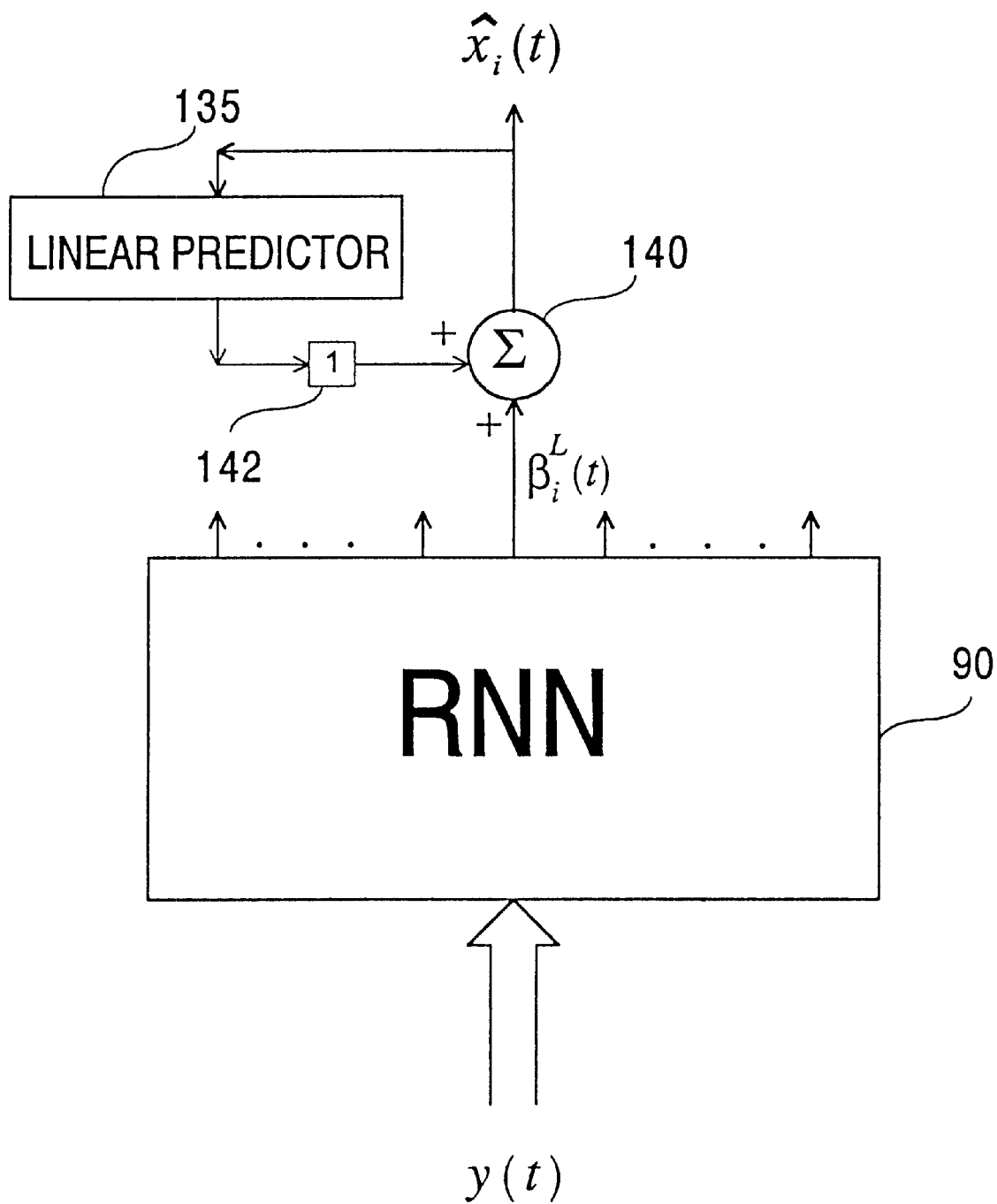
FIG. 11 shows one range extender by linear prediction and how it is connected to a recurrent neural network in a neural system. A range extender by linear predictor is a range extender by estimate addition, wherein the auxiliary estimator is a linear predictor 135 and a unit time delay device 142.

Consider the neural system depicted in FIG. 11 where only one range extender is shown. The one shown is a range extender by estimate addition, that consists of a linear predictor 135, a unit time delay device 142 and an adder 140, and is concatenated to output neuron i of an RNN 90. The estimate $\hat{x}_i(t)$ of the value $\hat{x}_i(t)$ of the outward output process at time t, to be added to $\beta_i^L(t)$ to yield $\hat{x}_i(t)$, i.e. $\hat{x}_i(t) = \beta_i^L(t) + \hat{x}_i(t)$, is generated by the linear predictor 135 and the unit time delay device 142, which constitute the auxiliary estimator in the range extender by estimate addition. Here the outward output process $\hat{x}$ is that of the trained neural system with all the weights (i.e. trainable weights of the RNN 90 and all the trainable coefficients of its preprocessors and postprocessors properly determined. Thus $\hat{x}_i(t)$ obtained by the linear predictor 135 and the unit time delay device 142 is also a good estimate of $x_i(t)$, the desired output at time t. A range extender by accumulation can be viewed as a special case in which $\hat{x}_i(t-1)$ is used as the predicted and delayed value of $\hat{x}_i(t)$.

A better estimate of $\hat{x}_i(t)$ than $\hat{x}_i(t-1)$, which is used in a range extender by accumulation, can be obtained by the linear predictor $\hat{x}_i(t) = \Sigma_{j=1}^{J} c_j \hat{x}_i(t-j)$, where J is a fixed positive integer called the order of the linear predictor, $c_j$ are the linear predictor coefficients (S. Haykin, *Adaptive Filter Theory*, 2nd edition, Prentice-Hall (1991)).

Notice that to determine the linear predictor coefficients in a standard way, realizations of the outward output process $\hat{x}_i(t)$ of the trained neural system are required. However, before the weights and coefficients of both the RNN and the linear predictor are fully determined, such realizations are not available.

If the realizations of the desired outward output process are available for training the neural system and thus also available for the determination of the mentioned linear predictor coefficients, we determine the linear predictor coefficients in the linear predictor $\hat{x}_i(t) = \Sigma_{j=1}^{J} c_j \hat{x}_i(t-j)$ for predicting $x_i(t)$ instead.

More specifically, we use realizations of the ith component $x_i(t)$ of the desired outward output process x to determine $c_j$, j=1, 2, . . . , J, so that the linear finite impulse response filter $\Sigma_{j=1}^{J} c_j x_i(t-j)$ predicts $x_i(t)$ in the standard sense. A fast and stable algorithm for this can be found in D. T. M. Slock and T. Kailath, "Numerically Stable Fast Transversal Filters for Recursive Least Squares Adaptive Filtering," *IEEE Transactions on Signal Processing*, Vol. 39, No. 1, pp. 92–114 (1991). Some other algorithms can be found in S. Haykin, *Adaptive Filter Theory*, 2nd edition, Prentice-Hall (1991).

Then we use these coefficients $c_j$, j=1, 2, . . . , J as the coefficients in the linear predictor $\hat{x}_i(t) = \Sigma_{j=1}^{J} c_j \hat{x}_i(t-j)$ for predicting $\hat{x}_i(t)$. The resulting linear predictor is expected to generate good estimate $\hat{x}_i(t)$ of $x_i(t)$, provided $\hat{x}_i(t)$ mimics $x_i(t)$ closely.

To initialize the linear predictor at t=1, we need the initialization values, $\hat{x}_i(-J+1)$, $\hat{x}_i(-J+2)$, . . . , $\hat{x}_i(0)$, in both the training and the operation of the neural system. If the signals, $x_i(-J+1)$, $x_i(-J+2)$, . . . , $x_i(0)$, are available at t=1 in the operation of the neural system in the application under consideration, we may include realizations of $x_i(-J+1)$, $x_i(-J+2)$, . . . , $x_i(0)$ in the training data set in addition to those of $x_i(1)$, $x_i(2)$, . . . , $x_i(T)$. In training, the realization of $x_i(-J+1)$, $x_i(-J+2)$, . . . , $x_i(0)$ is used as the initialization values, $\hat{x}_i(-J+1)$, $\hat{x}_i(-J+2)$, . . . , $\hat{x}_i(0)$.

If $x_i(-J+1)$, $x_i(-J+2)$, . . . , $x_i(0)$ are not available at time t=1, in the operation of the neural system in the application under consideration, we use the best a priori estimates of $x_i(-J+1)$, $x_i(-J+2)$, . . . , $x_i(0)$ instead. Once a method of initializing the linear predictor is chosen, it is consistently used in both the training and operation of the neural system.

If a trained neural system, including the linear predictor with length J, adder, and RNN, works satisfactorily, the process of designing a neural system is completed. Otherwise, we may increase J and repeat the above process of determining $c_j$ and then training the neural system again or we may adjust the values of $c_j$, j=1, 2, . . . , J together with the weights w of the RNN by minimizing the training criterion further, using the existing values of $c_j$ and w as the initial guess in the minimization process.

If the realizations of the desired outward output process are not available for the determination of the jog linear predictor coefficients $c_j$, these coefficients are determined jointly with the weights of the RNN in training the neural system.

It will be appreciated that the above arguments can be easily generalized to the vector case, in which a linear predictor generates a vector-valued estimate of a certain number of components of x(t), of which estimate a selected number of components are then added to their corresponding components of $\beta^L(t)$ to yield their corresponding components of $\hat{x}(t)$.

3. Range Extenders by Feedforward Linear Estimation

Figure 12:
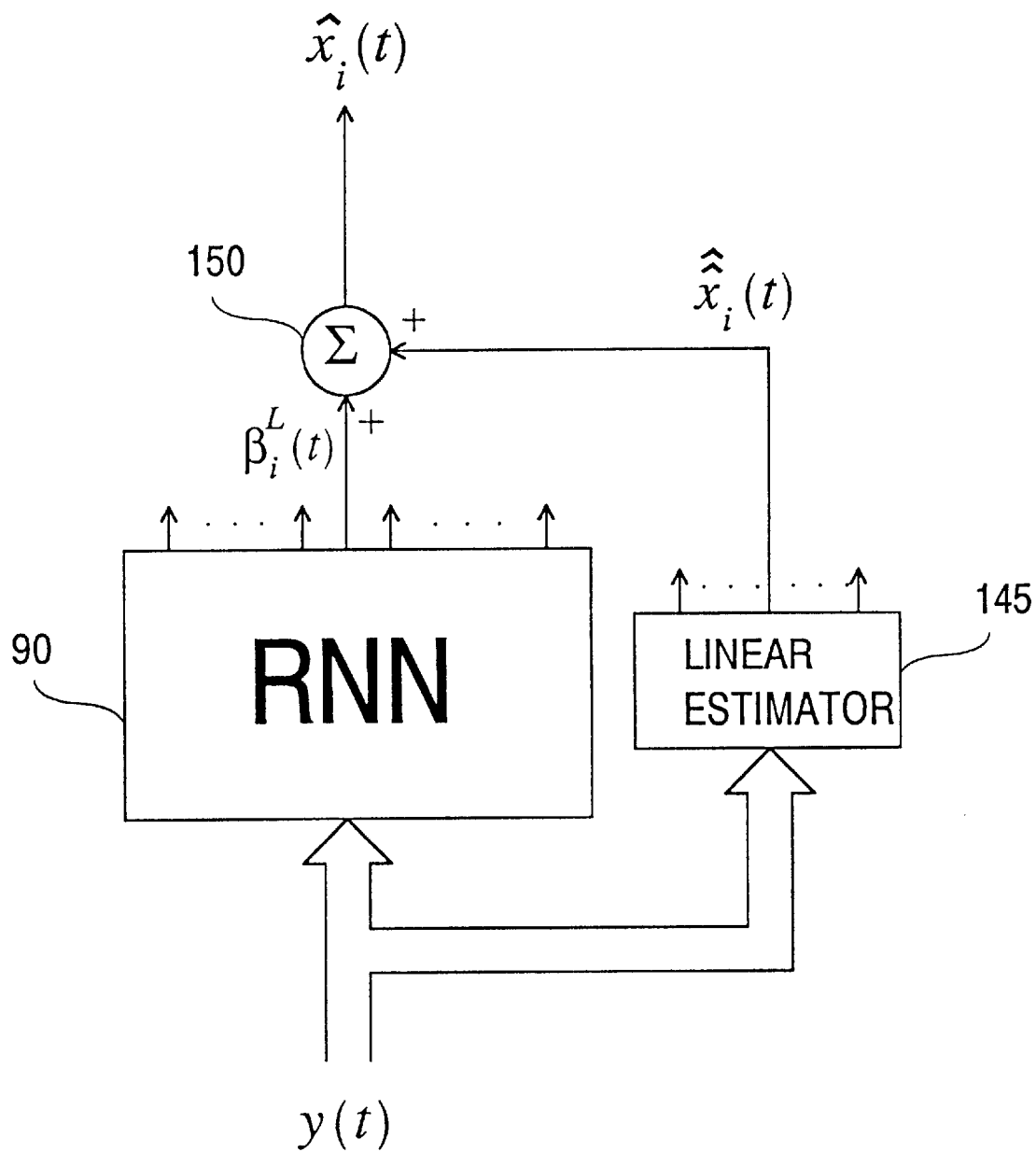
FIG. 12 shows one range extender by feedforward linear estimation and how it is connected to a recurrent neural network in a neural system. A range extender by feedforward linear prediction is a range extender by estimate addition, wherein the auxiliary estimator is a linear estimator 145, which inputs some or all components of the exogenous input process, and outputs estirrats of some or all components of the desired outward output process of the neural system.

Using a linear finite-impulse-response (FIR) filter as the auxiliary estimator to process the exogenous input process to estimate the desired outward output process, a range extender by estimate addition is obtained, which will be called a range extender by feedforward linear estimation. Such a range extender comprising a linear estimator (i.e. linear FIR filter) 145 and an adder 150 is shown in FIG. 12. The input vector to its auxiliary estimator 145 at time t is the value y(t) of the exogenous input process y, and the output vector of the auxiliary estimator 145 at the same time is the auxiliary estimate of those components of the desired outward output process that are dynamically transformed by said range extender. Let the vector with these components of the desired outward output process be denoted by z(t) and the auxiliary estimate of z(t) be denoted by $\tilde{z}(t)$.

The auxiliary estimator is a linear estimator described by $\hat{z}(t) = \Sigma_{j=0}^{J-1} C_j y(t-j)$, where J denotes the order of the linear estimator and $C_j$, for j=0, 1, . . . , J−1, are the coefficient matrices. It is assumed here also that realizations y(t,ω), ω∈S of the desired outward output process y are available for determining the linear estimator coefficients $C_j$. Using the components z(t,ω) of the realization x (t,ω) corresponding to those of $\tilde{z}(t)$ as the desired output, and y(t,ω) as the input for each ω in the sample set S, the coefficient matrices $C_j$ are determined by minimizing $\Sigma_{\omega \in S} \Sigma_{t=1}^{T} \| z(t,\omega) - \Sigma_{j=0}^{J-1} C_j y(t-j, \omega) \|^2$, where $\|\cdot\|$ is the Euclidean norm. Assuming that y(τ,ω) is zero for τ≤0 and ω∈S, the recursive least squares algorithm in D. T. M. Slock and T. K. Kailath, "Numerically Stable Fast Transversal Filtering for Recursive Least Squares Adaptive Filtering," *IEEE Dunsactions on Signal Processing*, Vol. 39, No. 1, pp. 92–114 (1991), can be applied to calculate the coefficient matrices, $C_j$, j=0, 1, . . . , J−1.

The estimate $\hat{x}_i(t)$ of $x_i(t)$ generated by the neural system depicted in FIG. 11 is the sum of $\hat{x}_i(t)$ and $\beta_i^L(t)$, the ith output of the RNN 90. To initialize the linear estimator in operation at t=1, we need the initialization values for y(−J+1), y(−J+2), . . . , y(0). If they are not available, we may set them equal to zero in training the neural system and then in operating the neural system. An alternative way to determine the initialization values is to optimize them jointly with the weights of the neural system.

Selecting Range Extenders and/or Reducers

Recall that range reducers and range extenders are dynamic rang transformers. If the exogneous input and/or desired outward output processes of a neural system under design have large and/or expanding ranges, dynmaic range transformer can be built into the neural system to alleviate the size requirements of the RNN and training data set, and alleviate the associated difficulty in training. Moreover, dynamic range transformer can greatly enhance the generalization capability of a neural system beyond the length of time for which the training data are available. Sometimes, a dynamic range transformer is used simply to achieve the purpose of reducing the approximation capability required of the RNN, without necessarily reducing the valid input or output range required of the RNN.

Figure 13:
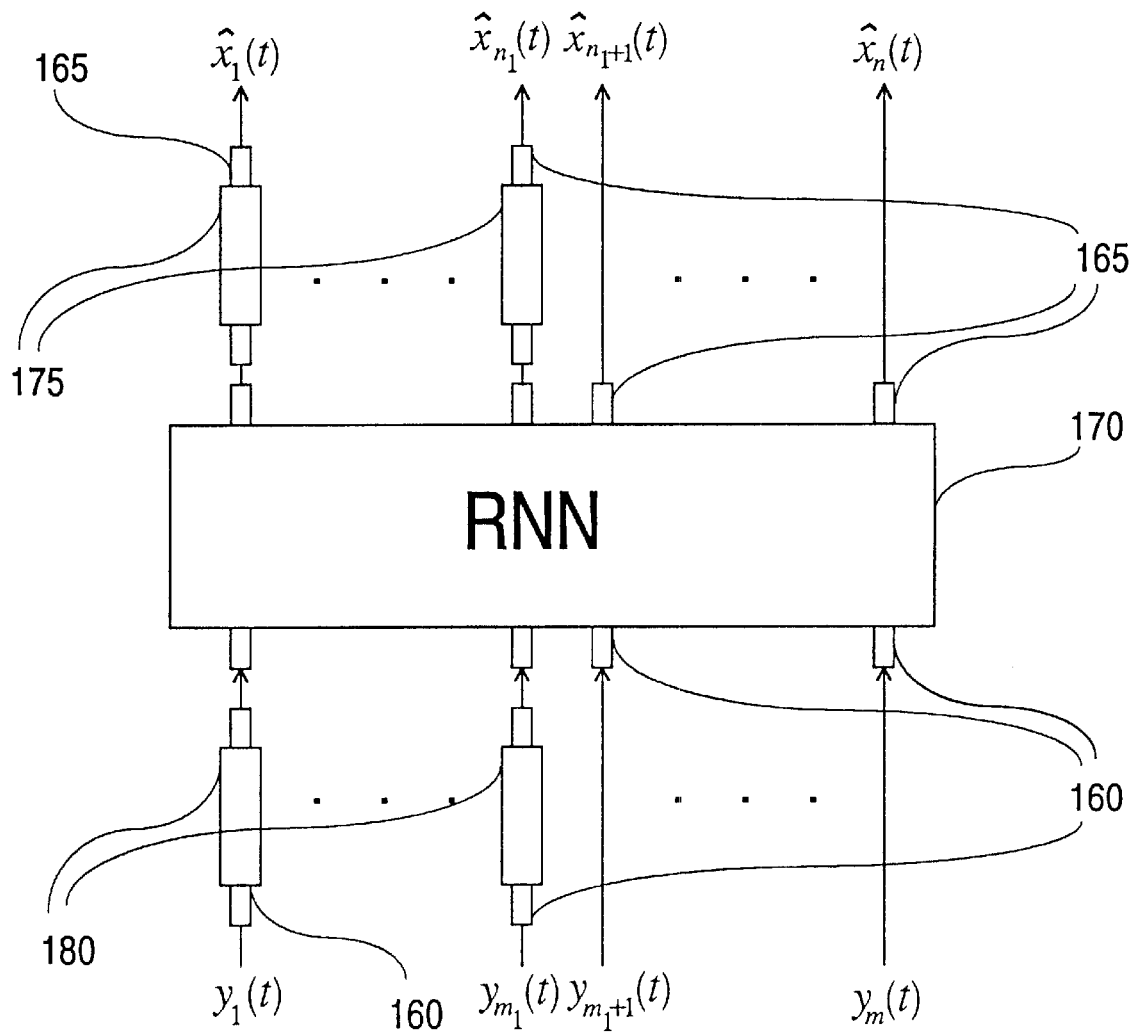
FIG. 13 shows a neural system receiving an exogenous input process $(y_1(t), y_2(t), \ldots, y_m(t))$ at the input terminals of the neural system and sending out an outward output process $(\hat{x}_1(t), \hat{x}_2(t), \ldots, \hat{x}_n(t))$ at the output terminals of the neural system at time t. Each of the components, $y_1(t), \ldots, y_{m_1}(t)$, is dynamically transformed by a range reducer. Each of the components, $\hat{x}_1(t), \ldots, \hat{x}_{n_1}(t)$, is the output of a range extender. The neural system shown is not the most general type. It is understood that a range reducer may input more than one component of the exogenous input process, and may send its outputs to more than one input neuron of the recurrent neural network in the neural system. It is also understood that a range extender may receive inputs from more than one output neuron of the recurrent neural network, and may produce more than one component of the outward output process of the neural system.

FIG. 13 shows a neural system receiving an exogenous input process $(y_1(t), y_2(t), \ldots, y_m(t))$ at the input terminals of the neural system and sending out an outward output process $(\hat{x}_1(t), \hat{x}_2(t), \ldots, \hat{x}_n(t))$ at the output terminals of the neural system at time t. Each of the components, $y_1(t), \ldots, y_{m_1}(t)$, is dynamically transformed by a range reducer. Each of the components, $\hat{x}_1(t), \ldots, \hat{x}_{n_1}(t)$, is the output of a range extender. The neural system shown is not the most general type. It is understood that a range reducer may input more than one component of the exogenous input process, and may send its outputs to more than one input neuron of the recurrent neural network in the neural system. It is also understood that a range extender may receive inputs from more than one output neuron of the recurrent neural network, and may produce more than one component of the outward output process of the neural system.

Range extenders and reducers may be very costly. For instance, if the RNN in the neural system is implemented on an analog neural network chip (e.g. Intel's 80170NX ETANN), the range extenders may have to be implemented in a separate digital computing device or the like, incurring extra cost. Digital computing devices are most suitable for the implementation of the range extenders and reducers, because they are used to deal with large and/or expanding ranges, which analog devices are inadequate to deal with with high accuracy.

There are three ways to examine the possible range of a component of an exogenous input process or a desired outward output process of a neural system under design. This component will now be referred to as the component process. First, we consider the physical meaning of the component process, which is usually sufficient for us to determine whether the range of the component process is large and/or expanding. For instance, the longitude and latitude of an ocean-going ship or a long range airplane usually have large and expanding ranges. On the other hand, the grey level of a pixel in a thermal imagery usually has a small and bounded range. Second, we analyze the dynamic equation (if it exists) that governs the evolution of the component process. For instance, if the dynamic equation is not BIBO (bounded-input-bounded-output) stable, the range of the component process is not even bounded in the long run. On the other hand, if the dynamic equation has a global attractor, which is super stable, the range of the component must be bounded, provided the perturbation term in the dynamic equation is also bounded. In this case, the bound of the component process can sometimes be determined from the bound of the perturbation. Third, we examine the realizations of the component process in the training data set. If some of the these realizations have a large range or have a tendency to grow, then the range of the component process should be regarded as large and/or expanding.

The adjective, "large," is, of course, a relative term. It has a lot to do with the "resolution" of the component process, that we are concerned with. For instance, if we want to estimate the location of a ship to within a standard error of 10 feet, a range of 10 miles is "very large." However, if we only want to estimate the ship location to within a standard error of ½ mile, the range of 10 mile is not large at all.

After examining the possible range of a component process, if we still have some doubt as to whether the range should be regarded as large, we can check if there is sufficient difference in performance between neural systems with and without a range extender or reducer for the component process to justify building such a range extender or reducer into the neural system.

Recall that a purpose of a range extender by estimate addition is to reduce the valid output range required of an output node of the RNN in a neural system and, with the aid of a range extender by estimate addition, the valid output range required is the range of the difference, at each time point, between the desired outward output of the output node and the auxiliary estimate generated by the auxiliary estimator in the range extender. Hence this range of the difference is a good measure of the need for a range extender by estimate addition. Recall also that a purpose of a range reducer by estimate subtraction is to reduce the valid input range (or valid domain) required of an input node of the RNN in a neural system and, with the aid of a range reducer by estimate subtraction, the valid input range required is the range of the difference, at each time point, between the corresponding exogenous input to the neural system and its estimate generated by the auxiliary estimator in the range reducer. Hence this range of the difference is a good measure of the need for a range reducer by estimate subtraction.

If the input process to the auxiliary estimator in a range extender or reducer is only part or all of the exogenous input process to a neural system, it is straightforward to evaluate the performance of the range extender or reducer. For instance, the auxiliary estimator used in a range extender by feedforward linear estimation, and the auxiliary estimators used in range reducers by differencing and by linear prediction all input part or all of the exogenous input process of a neural system and nothing else. To evaluate the performance of such an auxiliary estimator and thus the range extender or reducer that it serves, all that needs to be done is to apply the auxiliary estimator to the realizations of the part or all of the exogenous input process of the neural system under design, that are available in the training set, compute the estimation errors (i.e. $x_i(t,\omega) - \hat{x}_i(t, \omega)$ or $y_i(t,\omega) - \hat{y}_i(t,\omega)$) of the resulting estimates, and then examine the range of these errors, which is the desired measure of performance. Note that such an evaluation can be done before we start to train neural systems.

If the input process to the auxiliary estimator in a range extender or reducer involves the outputs of the neural system, a thorough evaluation of the performance of the range extender or reducer requires training the neural system first. The auxiliary estimators used in a range extender by accumulation and by linear prediction involve the outputs of the neural system in the auxiliary estimators' inputs.

Since training a neural system involves a great deal of computation, a method of evaluating the performance of such a range extender or reducer without first training a neural system is highly desirable, even if the method does not produce a perfectly accurate results. Let us now look at such a method. Suppose that a good neural system has been found and has a good performance. Then the outward output process of the neural system is closely approximated by its desired outward output process. Hence good approximate realizations of the output process of an auxiliary estimator, whose input process involves the outward output process of the neural system, can be obtained by replacing realizations of the outward output process with realizations of the desired outward output process for the inputing of the auxiliary estimator, provided these realizations of the desired outward output process are available. This method will be called a bootstrap method and usually provides an adequate measure of performance. For instance, the range of $x_i(t,\omega) - x_i(t-1,\omega)$, $t=2, 3, \ldots, T$, $\omega \in S$ is thus used as an approximate of the range of $x_i(t,\omega) - \hat{x}_i(t-1,\omega)$, $t-2, 3, \ldots, T$, $\omega \in S$, in checking if a range extender by accumulation is effective for the component process $x_i(t)$. To check if a range extender by linear prediction is effective, we examine the range of $x_i(t,\omega) - \Sigma_{j=1}^{J} c_j x_i(t-j,\omega)$, $t=J+1, J+2, \ldots, T$, $\omega \in S$, where J is the order of linear prediction.

However, if a thorough evaluation of a range extender or reducer, whose inputs involve the neural system outputs, is needed, then the training of neural systems is indispensible. Algorithms for training neural systems are provided in the sequel. To minimize computation involved in training, the evaluation and selection of dynamic range transformers, and the training of neural systems should be coordinated carefully. We use such a fixed RNN architecture that the architecture of the RNN is a neglegible factor in evaluating and selecting dynamic range transformers. We determine the RNN architecture to be eventually used in the neural system only after dynamic range transformers are selected. The foregoing bootstrap method can be first used to narrow down the kinds of dynamic range transformer for a more thorough evaluation. Here range extenders by linear prediction of different orders are considered as different kinds. Every time a neural system is trained, one or more kinds of dynamic range transformers are evaluated. The weights and initial dynamic state of the RNN of the given fixed architecture, resulting from training a neural system, can be used as initial values of the same weights and initial dynamic state for training the next neural system of the same RNN architecture so as to minimize computation costs.

The final selection of range extenders and reducers for a large RNN architecture is made in consideration of the computational and implementational costs of the dynamic range transformers, and, of course, the filtering performance of the neural system in order to optimize the cost-effectiveness of the neural system.

Training a Neural System Offline

Neural network training and synthesis are well-established concepts in the open literature, where there are many training and synthesis methods and techniques available. These methods and techniques are slightly modified for training and synthesizing neural systems disclosed herein. Here we present only those that we now prefer as examples. The scope of the present invention should not be limited by them.

Synthesizing training data into a neural system (NS) offline usually comprises training and testing at least one NS with an RNN from a selected RNN paradigm and with at least one selected dynamic range transformer, until the performance of an NS with respect to a selected performance criterion is satisfactory or can not be significantly improved by increasing the size of the NS, whichever comes first, and then selecting a trained and tested NS as the synthesized NS in consideration of NS size versus its, performance to optimize the cost-effectiveness. Sometimes trade-off between the RNN size and the dynamic range transformer types and kinds is considered and the trainings and testings of neural systems (NSs) with different combinations of the RNN size and the dynamic range transformer types are performed before the synthesized NS is selected.

The weights of the synthesized NS are held fixed during its operation, unless an online training is performed.

The performance criterion for an NS is a measure of the performance of the NS for its intended application. This measure is usually an expected value of a function, called a performance function, of the exogenous input process and/or some other processes affecting the performance, if the processes are stochatic processes, and is a weighted average of the same function over all possible realizations of the same processes, if these processes are deterministic processes. These processes defining the performance criterion may be natural in the operating environment of the NS or artificial (i.e. man-made or designed) for effecting the intended application, but are all regarded as processes in the operating environment. Some examples of these processes follow. If the NS is trained to be an optimal filter, the involved measurement process is a part or the whole of the exogenous input process, and another process affecting the performance criterion is the involved signal process. If the NS is trained to be a model reference controller, the exogenous input process comprises the input process to the involved reference model, and another process that affect the performance criterion is the output process of the reference model. If the NS is trained to be a system identifier in the series-parallel formulation, the exogenous input process is the input process and the unit-time delayed output process of the plant to be identified, and another process that affects the performance criterion is the output process of the plant.

A realization of the exogenous input process and/or the corresponding realizations of those other processes that are used to define the performance criterion are called a realization of the operating environment, which is denoted by $\omega$. A collection S of exemplary realizations $\omega$ that are available and used for training the neural system is called a training data set.

The training criterion is defined to reflect the performance criterion for the NS under training by using the exemplary realizations of the operating environment in the training data set. Assume for simplicity here that each exemplary realization w starts at time $t=-B$ and ends at time $t=T$, where B is a positive integer so large that all the initial states for the operating environment at time $t=0$ are specified and/or included in each of the exemplary realizations and T is a positive integer so large that the dynamics of the operating environment are believed to be sufficiently reflected or represented by the exemplary realizations. These exemplary realizations may be collected in computer simulations, actual experiments, past operations, or a combination thereof.

Let all the weights $\omega$ of the RNN and all the adjustable coefficients and initialization values of the dynamic range transformers in the NS be called the weights W of the NS. For each realization $\omega$, the exogenous input vector to the NS is denoted by $\zeta(t,\omega)$; and the output vector of the NS with weights W, after feeding $\zeta(s,\omega)$, $s=-B, -B+1, \ldots, t$ consecutively one at a time at the input neurons of the NS is denoted by $\gamma(t,\omega,W)$. The value of the aforementioned function $\rho$ for this realization $\omega$ is obtained by substituting $\omega$ for the corresponding processes in the aforementioned performance function. This value can usually be expressed in the form $\Sigma_{\tau=1}^{T} \rho(\tau,\omega,\gamma(\tau,\omega,W))$ for some function $\rho$. A training criterion defined to reflect the performance criterion is then $$Q(W) = \frac{1}{T(\#S)} \sum_{\omega \in S} \sum_{\tau=1}^{T} \rho(\tau, \omega, \gamma(\tau, \omega, W)), \quad (17)$$

where #S is the number of elements in the set S.

In training an NS with respect to this training criterion Q (W), we search for the values W* of the weights W such that Q (W*) is small, the NS with W* has a good generalization capability, the NS has a small number of weights, etc. Hence training the NS involves a method of minimizing Q (W) by the variation of W, a method such as a cross-validation technique to ensure a good generalization capability, and/or sometimes a neural network pruning technique.

The minimization problem involved is simply one of the unconstrained optimization problems that are studied in a very large field of numerical and theoretical research by the name of optimization theory. There are basically two types of method for unconstrained optimization. One type, including the stochastic approximation methods, the annealing methods and the clustering methods, needs only evaluations of the optimization criterion, and the other type requires also evaluations of its derivatives. The methods of both types, and their pros and cons, can be found in a large number of books and articles and will not be further discussed here. It is only stressed that any optimization method can be selected to train a neural system in accordance with the teachings of the present invention, provided that the selected training criterion, together with the neural system, satisfies the required conditions for the selected optimization method.

Nevertheless, due to the enormous number of weights (and the initial dynamic state components, if they are to be optimized as well) for even a small RNN, and the usually enormous amount of training data, training an RNN into a filter involves a very large amount of computation. Generally speaking, the type of optimization method that needs evaluations of the derivatives of the training criterion Q(W) is more efficient and converges faster than other type, if the derivatives can be evaluated. Due to the rich network structures of RNNs, many ideas for evaluating the derivatives of the training criterion, for training an RNN without range extenders or reducers, with respect to the weights w of the RNN, have been proposed. Perhaps the most widely used ideas are backpropagation through time (BPTT) and real-time recurrent learning (RTRL). A good introduction to BPTT and RTRL ideas with adequate references can be found on pages 182–186 of J. Hertz, A. Krogh and R. G. Palmer, *Introduction to the Theory of Neural Computation*, Addison Wesley (1991).

Nevertheless, the BPTT and the RTRL formulas for computing the derivatives are not available in the literature, and are not easy to derive for training, even for RNNs without range extenders or reducers. Among the RNN paradigms, we prefer MLPWINs and MLPWOFs for constructing a neural system here, because they are universal approximators of virtually any dynamic system. Between these two paradigms, we prefer MLPWINs, because the configuration of an MLPWIN with one layer of hidden neurons is determined by only the number of hidden neurons, while the configuration of an MLPWOF with one layer of hidden neurons is determined by not only the number of hidden neurons but also the number of free feedback sending neurons. The BPTT and RTRL formulas for differentiating Q(W) for training a neural system (NS) consisting of an MLPWIN or MLPWOF and selected range reducers by linear prediction and/or range extenders by linear prediction are stated in the form of pseudo computer programs in the following, which are extracted from U.S. Pat. No. 5,649,065 issued to the present inventors. These pseudo computer programs are also applicable to an NS with range reducers by differencing and/or range extenders by accumulation, since these dynamic range transformers are special cases of dynamic range transformers by linear prediction. First, let us establish more notations.

An MLPWIN or an MLPWOF in a neural system considered here is fully-connected and has L+1 layers of neurons including layer 0 containing the input neurons and layer L containing the output neurons. The set of the numberings of the input neurons in layer 0 is denoted by I and the set of the numberings of the output neurons in layer L is denoted by O. The set of the numberings of the input terminals of the neural system and the set of the numberings of the output terminals of the same neural system are equal to I and O, respectively. For the MLPWOF, the set of the numberings of the feedback-receiving neurons is denoted by $F_I$, and the set of the numberings of the feedback-sending neurons is denoted by $F_O$. It is assumed without loss of generality, that $F_I = F_O$ and if a feedback-receiving neuron and a feedback-sending neuron are connected for feedback, these two neurons have the same numbering in their respective layers. Hence $F_I$ and $F_O$ are denoted by F.

Each neuron in the MLPWIN or MLPWOF, including neurons in layer 0 and layre L, has an individual activation function. The activation function of neuron i in layer l is denoted by $a_i^l(\eta)$. There can be any number of different activation functions in the MLPWIN or MLPWOF, each being shared by any number of neurons. The derivative of $a_i^l(\eta)$ with respect to $\eta$ is denoted by $(a_i^l)'(\eta)$.

The exogenous input sequence in a training data set, that is indexed by $\omega \in S$, is denoted by $\zeta(t,\omega)$, whose components are numbered by the numberings from I. Every range reducer in the neural system is concatenated to an input neuron of the RNN. A range reducer and its input, say $\zeta_i(t,\omega)$, have the same numbering i as does its output $\beta_i^0(t,\omega)$ in consistency with the usage of the symbol $\beta_i^0(t)$ as the ith input to the RNN at time t. The set of the numberings of all the range reducers in the neural system is denoted by R. Note that R is a subset of I. For each $i \in I$, that does not belong to R, we set $\beta_i^0(t,\omega) = \zeta_i(t,\omega)$. Furthermore, the set of all numberings of the range reducers by linear prediction is denoted by $R_{LP}$. For each input neuron $i \in R_{LP}$, the linear predictor coefficients are $c_{ij}$, $j=1, 2, \ldots, J_i$, where $J_i$ is the order of the linear predictor, and for $t \le J_i$, $\beta_i^0 = \zeta_i(t) - \sum_{j=1}^{t-1} c_{ij} \zeta_i(t-j) - \sum_{j=t}^{J_i} c_{ij} u_{i(t-j)}$, where $u_{ij}$ are the initialization values of the linear predictor.

Every range extender in the neural system is concatenated to an output neuron of the RNN (an MLPWIN or MLPWOF). A range extender and its output, denoted by $\gamma_i(t,\omega)$, have the same numbering i as does its input $\beta_i^L(t,\omega)$, which is the output of its concatenated output neuron i of the RNN. The set of all the numberings of the range extenders in the neural system is denoted by $\epsilon$. Note that $\epsilon$ is a subset of O. For each $i \in O$, that does not belong to $\epsilon$, we define $\gamma y_i(t,\omega)$ to be equal to $\beta_i^L(t,\omega)$. We note that if the activation functions $a_i^L(\eta)$, $i \in 0$ are the identity function $a_i^L(\eta) = \eta$, $i \in O$, the activation level $\beta_i^L(t,\omega)$ is equal to $\eta_i^L(t,\omega)$, for each $i \in O$. Furthermore, the set of all numberings of the range extenders by linear prediction is denoted by $\epsilon_{LP}$. For output neuron $i \in \epsilon_{LP}$, the linear predictor coefficients are $c_{ij}$, $j=1, 2, \ldots, J_i$, where $J_i$ is the order of the linear predictor, and for $t \le J_i$, $\gamma_i(t) = \beta_i^L(t) + \hat{\gamma}_i(t)$, where $\hat{\gamma}_i(t) := \sum_{j=1}^{t-1} c_{ij} \gamma_i(t-j) + \sum_{j=t}^{J_i} c_{ij} s_{i(t-j)}$ is the output of the linear predictor, $s_{ij}$ being the initialization values of the linear predictor.

Let us write $Q(W)=\Sigma_{\omega \in S}Q_\omega$, where $$Q_\omega := \frac{1}{T(\#S)}\Sigma_{\tau=1}^T \rho(\tau, \omega, \gamma(\tau, \omega, W)).$$

Recall that ":=" denotes "is defined to be." Notice that $\gamma_i(t,\omega)$ is a function of the weights W. An activation level in the initial dynamic state $\beta(0)$ is denoted by $\beta_i^l(0)$, if the activation level is that of neuron i in layer l. In the following, the formulas for computing $dQ_\omega/d\beta_i^l(0)$, $dQ_\omega/d\omega_{ij}^l$ and $dQ_\omega/d\omega_{ij}^{rl}$ are given. The desired derivatives $dQ(\omega)/d\beta_i^l(0)$, $dQ(\omega)/d\omega_{ij}^l$ and $dQ(\omega)/d\omega_{ij}^{rl}$ are then obtained easily by the equations, $dQ(\omega)/d\beta_i^l(0)=\Sigma_{\omega \in S}dQ_\omega/d\beta_i^l(0)$, $dQ(\omega)/d\omega_{ij}^l=\Sigma_{\omega \in S}dQ_\omega/d\omega_{ij}^l$ and $dQ(\omega)/d\omega_{ij}^{rl}=\Sigma_{\omega \in S}dQ_\omega/d\omega_{ij}^{rl}$, respectively.

To simplify our description of the algorithms, the symbol $\Sigma_i$ (or $\Sigma_j$) denotes the summation over all the numberings of the neurons in the layer that neuron i (or j) appears. For instance, $\Sigma_j \omega_{ij}^l \beta_j^{l-1} := \Sigma_{j=0}^{m_{l-1}} \omega_{ij}^l \beta_j^{l-1}$ and $\Sigma_j \omega_{ji}^{l+1}(dQ_\omega/d\eta_j^{l+1}(t)) := \Sigma_{j=1}^{m_{l+1}} \omega_{ji}^{l+1}(dQ_\omega/d\eta_j^{l+1}(t))$. Furthermore, $\Sigma_t := \Sigma_{t=1}^T$, $\delta_{ij}$ is the Kronecker delta, i.e. $\delta_{ij}:=1$, if i=j and $\delta_{ij}:=0$, if i≠j, and the variable $\omega$ in $\beta_i^l(t,\omega)$ and $\eta_i^l(t,\omega)$ is suppressed. All the variables $\gamma_i(t)$, $\hat{\gamma}_i^l(t)$ and $\eta_i^l(t)$, all the derivatives of these variables, and all the derivatives with respect to these variables are understood to be zero for t>T or t<1. The variables $\omega_{ij}^{rL}$ are also set to be zero and are not updated.

The pseudo computer programs, which are to be given, are provided here mainly to explain the formulas for differentiating $Q_\omega$. They are therefore not the most efficient computationally. There are four "main programs," which provide an overview of the usages of the "subroutines." The "main programs" and "sub-routines" are all given self-explanatory names. Many comments are inserted to make the pseudo programs easy to understand. Every comment is preceded by "//."

Every weight, parameter, activation level in an initial state, and initialization value, that is to be optimized, is initially assigned a pseudo random number from the uniform distribution between −0.5 and 0.5. For a set of values for all the weights of the neural system under training and an $\omega \in S$, the vectors, $\zeta(t,\omega)$, t=1, 2, . . . , T, are input to the input neurons of the neural system one at a time t. Each vector $\zeta(t,\omega)$ is processed by the range reducers first, resulting in the range reducers' output vector, which is part or all of $\beta^0(t,\omega)$. The RNN's input vector $\beta^0(t,\omega)$ is then processed by the RNN from layer to layer, resulting in weighted sums $\eta_i^l(t,\omega)$ and activation levels $\beta_i^l(t,\omega)$ for i=1, 2, . . . , $\eta_l$ and l=1, 2, . . . , L. Finally, the RNN's outputs $\beta_i^L(t,\omega)$, i∈O are processed by the range extenders, resulting in the output vector $\gamma(t,\omega)$ of the neural system. All these resultant vectors, weighted sums, and activation levels are then available for use in the following pseudo computer programs.

Main program BPTT_for_Neural_System_with_MLPWIN:
begin
1. For t=T,T−1, . . . , 1, do
    Call subroutine BPTT_through_Extender;
    Call subroutine BPTT_through_MLPWIN;
end;
2. Call subroutine Differentiating_$Q_\omega$_wrt_Weight_for_MLPWIN_by_BPTT;
3. Call subroutine Differentiating_$Q_\omega$_wrt_Initial_State_for_MLPWIN_by_BPTT;
4. Call subroutine Differentiating_$Q_\omega$_wrt_LP_Coefficients_by_BPTT;
end.

Main program BPTT_for_Neural_System_with_MLPWOF:
begin
1. For t=T,T−1, . . . , 1, do
    Call subroutine BPTT_through_Extender;
    Call subroutine BPTT_through_MLPWOF;
end;
2. Call subroutine Differentiating_$Q_\omega$_wrt_Weight_for_MLPWOF_by_BPTT;
    3. Call subroutine Differentiating_$Q_\omega$_wrt_Initial_State_for_MLPWOF_by_BPTT;
4. Call subroutine Differentiating_$Q_\omega$_wrt_LP_Coefficients_by_BPTT;
end.

Main program RTRL_for_Neural_System_with_MLPWIN:
begin
1. For t=1, 2, . . . , T, do
    Call subroutine RTRL_through_Reducer,
    Call subroutine RTRL_through_MLPWIN;
    Call subroutine RTRL_through_Extender;
end;
2. Call subroutine Differentiating_$Q_\omega$_wrt_Weight_and_Initials_State_for_MLPWIN_by_RTRL;
3. Call subroutine Differentiating_$Q_\omega$_wrt_LP_Coefficients_by_RTRL;
end.

Main program RTRL_for_Neural_System_with_an_MLPWOF:
begin
1. For t=1, 2, . . . , T, do
    Call subroutine RTRL_through_Reducer;
    Call subroutine RTRL_through_MLPWOF;
    Call subroutine RTRL_through_Extender;
end;
2. Call subroutine Differentiating_$Q_\omega$_wrt_Weight_and_Initial_State_for_MLPWOF_by_RTRL;
3. Call subroutine Differentiating_$Q_\omega$_wrt_LP_Coefficients_by_RTRL;
end.

---

Subroutine BPTT_through_Extender:

// Backpropagation through range extenders to output neurons of RNN:

For each i ∈ O, do

If i ∉ $\epsilon_{LP}$ then $$\frac{dQ_w}{d\gamma_i(t)} = \frac{\partial Q_w}{\partial \gamma_i(t)};$$

If $i \in \epsilon_{LP}$ then
// output i is input to range extender by linear prediction
$$\frac{dQ_w}{d\gamma_i(t)} = \frac{\partial Q_w}{\partial \gamma_i(t)} + \sum_j c_{ij} \frac{dQ_w}{d\gamma_i(t+j)};$$

end;
Subroutine BPTT_through_MLPWIN:
// Backpropagation to output neurons of MLPWIN:
Fir each $i \in O$, do
$$\frac{dQ_w}{d\beta_i^L(t)} = \frac{dQ_w}{d\gamma_i(t)};$$

$$\frac{dQ_w}{d\eta_i^L(t)} = \frac{dQ_w}{d\beta_i^L(t)}((\alpha_i^L)'(\eta_i^L(t)));$$

// If scaling is used, replace $\alpha_i^L$ above with composition of
// scaling function and $\alpha_i^L$.
end;
// Backpropagation through hidden layers of MLPWIN:
For $l = L - 1, L - 2, \ldots, 1$, do
    For $i = 1, 2, \ldots, n_l$, do
$$\frac{dQ_w}{d\eta_i^l(t)} = \left(\sum_j w_{ji}^{l+1} \frac{dQ_w}{d\eta_j^{l+1}(t)} + \sum_j w_{ji}^{rl} \frac{dQ_w}{d\eta_j^l(t+1)}\right)((\alpha_i^l)'(\eta_i^l(t)))$$

end;
end;
// Backpropagation to input neurons of MLPWIN:
For $i = 1, 2, \ldots, n_0$, do
$$\frac{dQ_w}{d\eta_i^0(t)} = \sum_j w_{ji}^1 \frac{dQ_w}{d\eta_j^1(t)}((\alpha_i^0)'(\eta_i^0(t)))$$

// If scaling is used, replace $\alpha_i^0$ with composition of
// scaling function and $\alpha_i^0$.
end;
Subroutine Differentiating_Q_w_wrt_Weight_for_MLPWIN_by_BPTT:
For $l = 1, 2, \ldots, L$, do
    For $i = 1, 2, \ldots, n_l$, do
        For $j = 0, 1, \ldots, n_{l-1}$, do
$$\frac{dQ_w}{dw_{ij}^l} = \sum_t \frac{dQ_w}{d\eta_i^l(t)} \beta_j^{l-1}(t);$$

If $l \neq L$, then $\frac{dQ_w}{dw_{ij}^{rl}} = \sum_t \frac{dQ_w}{d\eta_i^l(t)} \beta_j^l(t-1)$ end;
    end;
end;
Subroutine Differentiating_Q_w_wrt_Initial_State_for_MLPWIN_by_BPTT:
For $l = 1, 2, \ldots, L - 1$, do
    For $i = 1, 2, \ldots, n_l$, do
$$\frac{dQ_w}{d\beta_i^l(0)} = \sum_j w_{ji}^{rl} \frac{dQ_w}{d\eta_j^l(1)}$$

end;
end;
Subroutine Differentiating_Q_w_wrt_LP_Coefficients_by_BPTT:
// Differentiating $Q_w$ wrt coefficients of range extender by LP:
For each $i \in \epsilon_{LP}$, do
    For $j = -J_i + 1, -J_i + 2, \ldots, 0$, do
$$\frac{dQ_w}{ds_{ij}} = \sum_{t=1}^{J_i+j} c_i(t-j) \frac{dQ_w}{d\gamma_i(t)}$$

end;

For j = 1, 2, ..., $J_i$, do
$$\frac{dQ_w}{dc_{ij}} = \sum_{t=j+1}^{T} \frac{dQ_w}{d\gamma_i(t)} \cdot \gamma_i(t-j) + \sum_{t=1}^{j} \frac{dQ_w}{d\gamma_i(t)} \cdot u_{i(t-j)}$$

end;
end;
// Differentiating $Q_w$ wrt initialization values of range reducer by LP:
For each $i \in R_{LP}$, do
    For j = $-J_i + 1, -J_i + 2, \ldots, 0$, do
$$\frac{dQ_w}{du_{ij}} = \sum_{t=1}^{J_i+j} (-c_{i(t-j)}) \frac{dQ_w}{d\eta_i^0(t)}$$

end;
end;
Subroutine BPTT_through_MLPWOF:
// Backpropagation to output neurons of MLPWOF:
For i = 1, 2, ..., $n_L$, do If $i \notin F$ and $i \in O$ then $\dfrac{dQ_w}{d\beta_i^L(t)} = \dfrac{dQ_w}{d\gamma_i(t)}$;

// output i above of MLPWOF is not fedback

If $i \in F$ and $i \notin O$ then $\dfrac{dQ_w}{d\beta_i^L(t)} = \dfrac{dQ_w}{d\eta_i^0(t+1)}$;

// output i above is free feedback

If $i \in F$ and $i \in O$ then $\dfrac{dQ_w}{d\beta_i^L(t)} = \dfrac{dQ_w}{d\gamma_i(t)} + \dfrac{dQ_w}{d\eta_i^0(t+1)}$;

// output i above is teach-forced feedback
$$\frac{dQ_w}{d\eta_i^L(t)} = \frac{dQ_w}{d\beta_i^L(t)}((\alpha_i^L)'(\eta_i^L(t)));$$

// If scaling is used, replace $\alpha_i^L$ with composition of
// scaling function and $\alpha_i^L$.
end;
For l = L − 1, L − 2, ..., 0, do
    For i = 1, 2, ..., $n_l$, do
$$\frac{dQ_w}{d\eta_i^l(t)} = \sum_j w_{ji}^{l+1} \frac{dQ_w}{d\eta_j^{l+1}(t)}((\alpha_i^l)'(\eta_i^l(t)))$$

end;
end;
// If scaling is used, replace $\alpha_i^0$ with composition of
// scaling function and $\alpha_i^0$.
Subroutine Differentiating_$Q_w$_wrt_Weight_for_MLPWOF_by_BPTT:
For l = 1, 2, ..., L, do
    For i = 1, 2, ..., $n_l$, do
        For j = 0, 1, ..., $n_{l-1}$, do
$$\frac{dQ_w}{dw_{ij}^l} = \sum_t \frac{dQ_w}{d\eta_i^l(t)} \beta_j^{l-1}(t)$$

end;
end;
end;
Subroutine Differentiating_$Q_w$_wrt_Initial_State_for_MLPWOF_by_BPTT:
For each $i \in F$, do
$$\frac{dQ_w}{d\beta_i^L(0)} = \frac{dQ_w}{d\eta_j^0(1)}$$

end;

-continued

Subroutine RTRL_through_Reducer:
   // Forwardpropagation to input neurons of RNN:
   For each $i \in I$, do
   // Forwardpropagating derivatives wrt initialization values for range reducer:
      For each $p \in R_{LP}$, do
         For $q = -J_p + 1, -J_p + 2, \ldots, 0$, do $$\frac{d\beta_i^0(t)}{du_{pq}} = \left( -\delta_{ip} \sum_{j=-J_p+t}^{0} \delta_{qj} c_{p(t-j)} \right) ((a_i^0)'(\eta_i^0(t)));$$

end;
      end;
      If called by main program RTRL_for_Neural_System_with_MLPWOF then
   // Forwardpropagating derivatives wrt inital dynamic state for MLPWOF:
      For each $p \in F$, do $$\frac{d\beta_i^0(t)}{d\beta_p^L(0)} = 0;$$

end;
      For $k = 1, 2, \ldots, L$, do
         For $p = 1, 2, \ldots, n_k$, do
            If called by main program RTRL_for_Neural_System_with_MLPWIN then
   // Forwardpropagating derivatives wrt inital dynamic state for MLPWIN:

$$\frac{d\beta_i^0(t)}{d\beta_p^k(0)} = 0;$$

// Forwardpropagating derivatives wrt delayless weights:
            For $q = 0, 1, \ldots, n_{k-1}$, do $$\frac{d\beta_i^0(t)}{dw_{pq}^k} = 0;$$

end;
            If called by main program RTRL_for_Neural_System_with_MLPWIN then
   // Forwardpropagating derivatives wrt delay weights for MLPWIN:
            For $q = 1, 2, \ldots, n_k$, do $$\frac{d\beta_i^0(t)}{dw_{pq}^{rk}} = 0;$$

end;
         end;
      end;
   // Forwardpropagating derivatives wrt coefficients for range extenders by linear prediction:
      For each $p \in \epsilon_{LP}$, do
         For $q = -J_p + 1, -J_p + 2, \ldots, 0$, do $$\frac{d\beta_i^0(t)}{ds_{pq}} = 0;$$

end;
         For $q = 1, 2, \ldots, J_p$, do $$\frac{d\beta_i^0(t)}{ds_{pq}} = 0;$$

end;
      end;
   end;
Subroutine RTRL_through_MLPWIN:
   // Forwardpropagation through MLPWIN
   For $l = 1, 2, \ldots, L$, do
      For $i = 1, 2, \ldots, n_l$, do
   // Forwardpropagating derivatives wrt initialization values for range reducer:
         For each $p \in R_{LP}$, do
            For $q = -J_p + 1, -J_p + 2, \ldots, 0$, do $$\frac{d\beta_i^l(t)}{du_{pq}} = \left( \sum_j w_{ij}^l \frac{d\beta_j^{l-1}(t)}{du_{pq}} + \sum_j w_{ij}^{rl} \frac{d\beta_j^l(t-1)}{du_{pq}} \right) ((a_i^l)'(\eta_i^l(t)))$$

end;
         end;

```
        For k = 1, 2, . . . , L, do
// Forwardpropagating derivatives wrt initial dynamic state:
            For p = 1, 2, . . . , n_k, do
```

$$\frac{d\beta_i^l(t)}{d\beta_p^k(0)} = \left( \sum_j w_{ij}^l \frac{d\beta_j^{l-1}(t)}{d\beta_p^k(0)} + \sum_j w_{ij}^{rl} \frac{d\beta_j^l(t-1)}{d\beta_p^k(0)} + \delta_{lk}\delta_{t1} w_{ip}^{rk} \right)((\alpha_i^l)'(\eta_i^l(t)))$$

```
// Forwardpropagating derivatives wrt delayless weights:
            For q = 0, 1, . . . , n_{k-1}, do
```

$$\frac{d\beta_i^l(t)}{dw_{pq}^k} = \left( \sum_j w_{ij}^l \frac{d\beta_j^{l-1}(t)}{dw_{pq}^k} + \sum_j w_{ij}^{rl} \frac{d\beta_j^l(t-1)}{dw_{pq}^k} + \delta_{lk}\delta_{ip}\beta_q^{l-1}(t) \right)((\alpha_i^l)'(\eta_i^l(t)))$$

```
                end;
// Forwardpropagating derivatives wrt delay weights:
            For q = 1, 2, . . . , n_k, do
```

$$\frac{d\beta_i^l(t)}{dw_{pq}^{rk}} = \left( \sum_j w_{ij}^l \frac{d\beta_j^{l-1}(t)}{dw_{pq}^{rk}} + \sum_j w_{ij}^{rl} \frac{d\beta_j^l(t-1)}{dw_{pq}^{rk}} + \delta_{lk}\delta_{ip}\beta_q^l(t-1) \right)((\alpha_i^l)'(\eta_i^l(t)))$$

```
                end;
            end;
        end;
// Forwardpropagating derivatives wrt coefficients of range extenders by linear prediction:
        For each p ∈ ε_{LP}, do
            For q = -J_p + 1, -J_p + 2, . . . , 0, do
```

$$\frac{d\beta_i^l(t)}{ds_{pq}} = \left( \sum_j w_{ij}^l \frac{d\beta_j^{l-1}(t)}{ds_{pq}} + \sum_j w_{ij}^{rl} \frac{d\beta_j^l(t-1)}{ds_{pq}} \right)((\alpha_i^l)'(\eta_i^l(t)))$$

```
            end;
            For q = 1, 2, . . . , J_p, do
```

$$\frac{d\beta_i^l(t)}{dc_{pq}} = \left( \sum_j w_{ij}^l \frac{d\beta_j^{l-1}(t)}{dc_{pq}} + \sum_j w_{ij}^{rl} \frac{d\beta_j^l(t-1)}{dc_{pq}} \right)((\alpha_i^l)'(\eta_i^l(t)))$$

```
            end;
        end;
//If scaling is used, replace α_i^L with composition of
// scaling function and α_i^L.
    end;
end;
Subroutine RTRL_through_Extender:
// Forwardpropagation to output terminals of neural system:
// For each i ∈ O, do
// Forwardpropagating derivatives wrt initialization values of range reducer:
    For each p ∈ R_{LP}, do
        For q = -J_p + 1, -J_p + 2, . . . , 0, do
```

$$\text{If } i \in \varepsilon_{LP} \text{ then } \frac{d\gamma_i(t)}{du_{pq}} = \sum_{j=1}^{J_i} c_{ij} \frac{d\gamma_i(t-j)}{du_{pq}} + \frac{d\beta_i^L(t)}{du_{pq}},$$

```
// output i above is extended by range extender by linear prediction
```

$$\text{else } \frac{d\gamma_i(t)}{du_{pq}} = \frac{d\beta_i^L(t)}{du_{pq}};$$

```
// output i above is not extended by linear prediction
        end;
    end;
    If called by main program RTRL_for_Neural_System_with_MLPWOF then
// Forwardpropagating derivatives wrt initial dynamic state of MLPWOF:
        For each p ∈ F, do
```

$$\text{If } i \in \varepsilon_{LP} \text{ then } \frac{d\gamma_i(t)}{d\beta_p^L(0)} = \sum_{j=1}^{J_i} c_{ij} \frac{d\gamma_i(t-j)}{d\beta_p^L(0)} + \frac{d\beta_i^L(t)}{d\beta_p^L(0)},$$

-continued $$\text{else } \frac{d\gamma_i(t)}{d\beta_p^L(0)} = \frac{d\beta_i^L(t)}{d\beta_p^L(0)};$$

end;
For k = 1, 2, . . . , L, do
    For p = 1, 2, . . . , $n_k$, do
        If called by main program RTRL_for_Neural_System_with_MLPWIN then
// Forwardpropagating derivatives wrt initial dynamic state of MLPWIN:

$$\text{If } i \in \varepsilon_{LP} \text{ then} \frac{d\gamma_i(t)}{d\beta_p^k(0)} = \sum_{j=1}^{J_i} c_{ij} \frac{d\gamma_i(t-j)}{d\beta_p^k(0)} + \frac{d\beta_i^L(t)}{d\beta_p^k(0)},$$

$$\text{else } \frac{d\gamma_i(t)}{d\beta_p^k(0)} = \frac{d\beta_i^L(t)}{d\beta_p^k(0)};$$

// Forwardpropagating derivatives wrt delayless weights:
    For q = 0, 1, . . . , $n_{k-1}$, do $$\text{If } i \in \varepsilon_{LP} \text{ then} \frac{d\gamma_i(t)}{dw_{pq}^k} = \sum_{j=1}^{J_i} c_{ij} \frac{d\gamma_i(t-j)}{dw_{pq}^k} + \frac{d\beta_i^L(t)}{dw_{pq}^k},$$

$$\text{else } \frac{d\gamma_i(t)}{dw_{pq}^k} = \frac{d\beta_i^L(t)}{dw_{pq}^k};$$

end;
If called by main program RTRL_for_Neural_System_with_MLPWIN then
// Forwardpropagating derivatives wrt delay weights of MLPWIN:
    For q = 1, 2, . . . , $n_k$, do $$\text{If } i \in \varepsilon_{LP} \text{ then} \frac{d\gamma_i(t)}{dw_{pq}^{rk}} = \sum_{j=1}^{J_i} c_{ij} \frac{d\gamma_i(t-j)}{dw_{pq}^{rk}} + \frac{d\beta_i^L(t)}{dw_{pq}^{rk}},$$

$$\text{else } \frac{d\gamma_i(t)}{dw_{pq}^{rk}} = \frac{d\beta_i^L(t)}{dw_{pq}^{rk}};$$

end;
  end;
end;
// Forwardpropagating derivatives wrt coefficients of range extenders by linear prediction:
For each p ∈ $\epsilon_{LP}$, do
    For q = $-J_p$ + 1, $-J_p$ + 2, . . . , 0, do $$\text{If } i \in \varepsilon_{LP} \text{ then} \frac{d\gamma_i(t)}{ds_{pq}} = \sum_{j=1}^{J_i} c_{ij} \frac{d\gamma_i(t-j)}{ds_{pq}} + \frac{d\beta_i^L(t)}{ds_{pq}} + \delta_{ip} \sum_{j=-J_i+t}^{0} c_i(t-j)\delta_{jq},$$

$$\text{else } \frac{d\gamma_i(t)}{ds_{pq}} = \frac{d\beta_i^L(t)}{ds_{pq}};$$

end;
    For q = 1, 2, . . . , $J_p$, do $$\text{If } i \in \varepsilon_{LP} \text{ then} \frac{d\gamma_i(t)}{dc_{pq}} = \sum_{j=1}^{J_i} c_{ij} \frac{d\gamma_i(t-j)}{dc_{pq}} + \frac{d\beta_i^L(t)}{dc_{pq}} + \delta_{ip}\gamma_i(t-q) + \delta_{ip}\sum_{j=t}^{J_i} \delta_{jq} s_{i(t-j)},$$

$$\text{else } \frac{d\gamma_i(t)}{dc_{pq}} = \frac{d\beta_i^L(t)}{dc_{pq}};$$

end;
  end;
end;
Subroutine Differentiating_$Q_w$_wrt_Weight_and_Initial_State_for_MLPWIN_by_RTRL:
For l = 1, 2, . . . , L, do
    For p = 1, 2, . . . , $n_l$, do $$\frac{dQ_w}{d\beta_p^L(0)} = \sum_{t} \sum_{i \in O} \frac{\partial Q_w}{\partial \gamma_i(t)} \frac{d\gamma_i(t)}{d\beta_p^L(0)};$$

-continued

For q = 0, 1, . . . , $n_{l-1}$, do
$$\frac{dQ_w}{dw_{pq}^l} = \sum_t \sum_{i \in O} \frac{\partial Q_w}{\partial \gamma_i(t)} \frac{d\gamma_i(t)}{dw_{pq}^l}$$

end;
For q = 1, 2, . . . , $n_l$, do
$$\frac{dQ_w}{dw_{pq}^{rl}} = \sum_t \sum_{i \in O} \frac{\partial Q_w}{\partial \gamma_i(t)} \frac{d\gamma_i(t)}{dw_{pq}^{rl}}$$

end;
end;
end;
Subroutine Differentiating__$Q_w$__wrt__LP__Coefficients__by__RTRL:
For each p ∈ $R_{LP}$, do
For q = $-J_p$ + 1, $-J_p$ + 2, . . . , 0, do
$$\frac{dQ_w}{du_{pq}} = \sum_t \sum_{i \in O} \frac{\partial Q_w}{\partial \gamma_i(t)} \frac{d\gamma_i(t)}{du_{pq}}$$

end;
end;
For each p ∈ $\epsilon_{LP}$, do
For q = $-J_p$ + 1, $-J_p$ + 2, . . . , 0, do
$$\frac{dQ_w}{ds_{pq}} = \sum_t \sum_{i \in O} \frac{\partial Q_w}{\partial \gamma_i(t)} \frac{d\gamma_i(t)}{ds_{pq}}$$

end;
For q = 1, 2, . . . , $J_p$, do
$$\frac{dQ_w}{dc_{pq}} = \sum_t \sum_{i \in O} \frac{\partial Q_w}{\partial \gamma_i(t)} \frac{d\gamma_i(t)}{dc_{pq}}$$

end;
end;
Subroutine RTRL__through__MLPWOF:
// Forwardpropagation of delayed outputs of MLPWOF to input neurons:
For each i ∈ F, do
// Forwardpropagating derivatives wrt initialization values of range reducer:
For each p ∈ $R_{LP}$, do
For q = $-J_p$ + 1, $-J_p$ + 2, . . . , 0, do
$$\frac{d\beta_i^0(t)}{du_{pq}} = \frac{d\beta_i^L(t-1)}{du_{pq}}((\alpha_i^0)'(\eta_i^0(t)));$$

end;
end;
// Forwardpropagating derivatives wrt initial dynamic state:
For each p ∈ F, do
$$\frac{d\beta_i^0(t)}{d\beta_p^L(0)} = \left(\frac{d\beta_i^L(t-1)}{d\beta_p^L(0)} + \delta_{ip}\delta_{t1}\right)((\alpha_i^0)'(\eta_i^0(t)))$$

end;
For k = 1, 2, . . . , L, do
For p = 1, 2, . . . , $n_k$, do
// Forwardpropagating derivatives wrt delayless weights:
For q = 0, 1, . . . , $n_{k-1}$, do
$$\frac{d\beta_i^0(t)}{dw_{pq}^k} = \frac{d\beta_i^L(t-1)}{dw_{pq}^k}((\alpha_i^0)'(\eta_i^0(t)))$$

end;
end;
end;
// Forwardpropagating derivatives wrt coefficients of range extenders by linear prediction:
For each p ∈ $\epsilon_{LP}$, do
For q = $-J_p$ + 1, $-J_p$ + 2, . . . , 0, do
$$\frac{d\beta_i^0(t)}{ds_{pq}} = \frac{d\beta_i^L(t-1)}{ds_{pq}}((\alpha_i^0)'(\eta_i^0(t)))$$

end;

-continued

```
                    For q = 1, 2, . . . , J_p, do
```
$$\frac{d\beta_i^0(t)}{dc_{pq}} = \frac{d\beta_i^L(t-1)}{dc_{pq}}((\alpha_i^0)'(\eta_i^0(t)))$$

```
                    end;
                end;
            end;
// Forwardpropagation through MLPWOF:
For l = 1, 2, . . . , L, do
    For i = 1, 2, . . . , n_l, do
// Forwardpropagating derivatives wrt initialization values of range reducer:
        For each p ∈ R_LP, do
            For q = -J_p + 1, -J_p + 2, . . . , 0, do
```
$$\frac{d\beta_i^l(t)}{du_{pq}} = \sum_j w_{ij}^l \frac{d\beta_j^{l-1}(t)}{du_{pq}}((\alpha_i^l)'(\eta_i^l(t)))$$

```
            end;
        end;
// Forwardpropagating derivatives wrt initial dynamic state:
        For each p ∈ F, do
```
$$\frac{d\beta_i^l(t)}{d\beta_p^L(0)} = \sum_j w_{ij}^l \frac{d\beta_j^{l-1}(t)}{d\beta_p^L(0)}((\alpha_i^l)'(\eta_i^l(t)))$$

```
        end;
// Forwardpropagating derivatives wrt delayless weights:
        For k = 1, 2, . . . , L, do
            For p = 1, 2, . . . , n_k, do
                For q = 0, 1, . . . , n_{k-1}, do
```
$$\frac{d\beta_i^l(t)}{dw_{pq}^k} = \left(\sum_j w_{ij}^l \frac{d\beta_j^{l-1}(t)}{dw_{pq}^k} + \delta_{lk}\delta_{ip}\beta_q^{l-1}(t)\right)((\alpha_i^l)'(\eta_i^l(t)))$$

```
                end;
            end;
        end;
// Forwardpropagating derivatives wrt coefficients of range extenders by linear prediction:
        For each p ∈ ε_LP, do
            For q = -J_p + 1, -J_p + 2, . . . , 0, do
```
$$\frac{d\beta_i^l(t)}{ds_{pq}} = \sum_j w_{ij}^l \frac{d\beta_j^{l-1}(t)}{ds_{pq}}((\alpha_i^l)'(\eta_i^l(t)))$$

```
            end;
            For q = 1, 2, . . . , J_p, do
```
$$\frac{d\beta_i^l(t)}{dc_{pq}} = \sum_j w_{ij}^l \frac{d\beta_j^{l-1}(t)}{dc_{pq}}((\alpha_i^l)'(\eta_i^l(t)))$$

```
            end;
        end;
    end;
end;
Subroutine Differentiating_Q_w_wrt_Weight_and_Initial_State_for_MLPWOF_by_RTRL:
    For each p ∈ F, do
```
$$\frac{dQ_w}{d\beta_p^L(0)} = \sum_t \sum_{i \in O} \frac{\partial Q_w}{\partial \gamma_i(t)} \frac{d\gamma_i(t)}{d\beta_p^L(0)};$$

```
end;
For l = 1, 2, . . . , L, do
    For p = 1, 2, . . . , n_l, do
        For q = 0, 1, . . . , n_{l-1}, do
```
$$\frac{dQ_w}{dw_{pq}^l} = \sum_t \sum_{i \in O} \frac{\partial Q_w}{\partial \gamma_i(t)} \frac{d\gamma_i(t)}{dw_{pq}^l}$$

```
        end;
    end;
end;
```

If an MLPWIN or an MLPWOF has fixed weights, we may first include these fixed weights in w and use the pseudo computer programs to evaluate all derivatives of Q(W) with respect to all weights. Those derivatives of Q(W) with respect to the fixed weights are then discarded. A missing connection is regarded as a connection with a fixed weight equal to zero.

The derivatives $dQ(W)/d\omega_{ij}^l$, $dQ(W)/d\omega_{ij}^{rl}$ and $dQ(W)/d\beta_i^l(0)$ for an MLPWIN (or $dQ(W)/d\omega_{ij}^l$ and $dQ(W)/d\beta_i^l(0)$ for an MLPWOF) and derivatives of Q(W) with respect to coefficients and initialization values of range tranformers to be optimized and computed in the foregoing algorithm constitute the gradient of Q(W) with respect to $\omega$ for the neural system with an MLPWIN (or respectively MLPWOF). Given the gradient, to be denoted by $\nabla Q(W)$, the gradient descent methods, the conjugate gradient methods and the quasi-Newton methods can be applied. There is a large variety of gradient descent methods, but a basic gradient descent method is an iterative method and improves the value of W in each iteration by $$W^{new} = W^{old} - q\nabla Q(W), \qquad (18)$$

where q is a positive constant called the step size. The application of this basic gradient descent method to training RNNs is mentioned on pages 174 and 185 of J. Hertz, A. Krogh and R. G. Palmer, *Introduction to the Theory of Neural Computation*, Addison Wesley (1991). The conjugate gradient methods and the quasi-Newton methods are well-known methods for optimization. A good introduction to them can be found in D. G. Luenberger, *Linear and Nonlinear Programming*, second edition, Addison-Wesley (1973). Some ready to run routines that implement some powerful variants of these methods can be found in W. H. Press, S. A. Teukolsky, W. T. Vetterling and B. P. Flannery, *Numerical Recipes in C*, second edition, Cambridge University Press (1992). In the book, the routine for the conjugate gradient method is called frprmn (p.423) and the routine for the quasi-Newton method is called dfpmin (p.428). A floppy diskett containing the routines is provided in the book.

For evaluating the derivatives of Q(W), BPTT involves much less computation, but much more memory space than RTRL. For minimizing Q(W) given its derivatives, quasi-Newton and conjugate gradient methods require about the same amount of computation in each iteration, but the former converges faster than the latter. Quasi-Newton methods also need much more memory space than do conjugate gradient methods. Hence, if plenty of memory space is available in a computer, a combination of BPTT and a quasi-Newton method is preferred on the computer. However, if the memory space is limited in a computer for synthesizing given training data into a filter, a combination of RTRL and a conjugate gradient method is preferred on the computer. Different combinations are possible for different degrees of availability of the memory space in a computer.

Two somewhat different methods of training RNNs use extended Kalman filter (EKF) and are proposed in G. V. Puskorius and L. A. Feldkamp, "Recurrent Network Training with the Decoupled Extended Kalman Filter Algorithm," *Science of Artificial Neural Networks*, edited by D. W. Ruck, Proceedings SPIE 1710, pp.461–473 (1992), and in R. J. Williams, "Training Recurrent Networks Using the Extended Kalman Filter," *Proceedings of the 1992 International Joint Conference on Neural Networks*, Baltimore, Md., pp. IV 241–246 (1992), which are incorporated herein by reference. These EKF methods also require evaluation of the derivatives of Q(W).

Another optimization method worth mentioning is the simultaneous perturbation stochastic approximation (SPSA) algorithms introduced by J. C. Spall, "Multivariate Stochastic Approximation Using a Simultaneous Perturbation Gradient Approximation," *IEEE Transactions on Automatic Control*, Volume 37, No. 3, pp. 332–341 (1992) and J. C. Spall, "Stochastic Version of Second-Order (Newton-Raphson) Optimization Using Only Function Measurements," *Proceedings of the 1995 Winter Simulation Conference*, edited by C. Alexopoulos and K. Kang (1995). Applied to a nonadaptive training, these algorithms require only evaluations of the nonadaptive training criterion, but do not require calculations of its derivatives.

Most of the foregoing optimization algorithms are iterative in nature. The weights of the neural system to be optimized are randomly selected at the beginning of the algorithm. If the initial dynamic state is to be optimized as well, it is either randomly selected or set equal to a canonical initial dynamic state at the beginning of the optimization process. The adjustable weights and initial dynamic state are then adjusted iteratively until the value of the training criterion ceases to improve by more than a preset small number, say $10^{-12}$.

It is known that most training criteria contain many undesired local minima, where a local search optimization method can get trapped. Therefore, if a local search method is used, it should be applied a number of times starting at different (randomly or systematically chosen) initial values for the optimization variables (i.e. the weights and sometimes, initial dynamic state of the neural system). Alternatively, a global search method such as an annealing method, a genetic algorithm or a clustering method can be used for training.

A standard statistical technique, known as cross-validation, can be used to improve or help ensure the generalization capability of the NS. The idea is to use a second training data set, S', that is collected in the same way as the first training data set, S, and is called the testing data set. A second training criterion, Q', that is constructed using the testing data set in the same way the first training criterion, Q, is constructed using the training data set, is called the test criterion. In the process of training an NS, Q' is evaluated for each new value of the vector variable $\omega$. The training process is stopped, if Q' starts to increase significantly or if Q' cannot be further decreased significantly.

Techniques for pruning a recurrent neural network, which are similar to those network-pruning techniques introduced in Simon Haykin, *Neural Networks—A Comprehensive Foundation*, pp. 205–212, Macmillan College Publishing Company, Inc. (1994) can reduce the number of connections (delayless and delay connections) and help improve the generalization capability of an NS under training. If an NS prunig method is applied, only those connections with weights whose being pruned does not significantly increase P and/or reduce the generalization capability of the NN are allowed to be pruned. The foregoing training result is modified by setting the weights of pruned connections equal to zero and setting the weights of all the connections incident to pruned neurons equal to zero.

In many applications, the exogenous input process and/or other processes that are used to define the performance criterion are dependent on a vector-valued environmental parameter $\theta$, which is unknown and/or changes from time to time during the operation of the NS. In this case, the operating environment of the NS Is said to be dependent on an environmental parameter. If realizations of the operating environment are available for each of a set $\Theta$ of typical values of the environmental parameter θ, a recursive neural network, that is synthesized from these realizations, can have adaptive ability to adapt to the environmental parameter. This capability of a recursive neural network was mentioned in L. A. Feldkamp and G. V. Puskorius, "Training of robust neural controller," in *Proceedings of the 33rd Conference on Decision and Control*, pp. 2754–2759, Lake Buena Vista, Fla., 1994, and James Ting-Ho Lo and Lei Yu, "Adaptive neural filtering by using the innovations process," in *Proceedings of the 1995 World Congress on Neural Networks*, Vol. II, pp. 29–35, Washington, D.C., 1995. An NS consisting of a recursive neural network and at least one range reducer by linear prediction and/or range extender by linear prediction has the same capability.

Let the realizations of the operating environment ω that are available for the typical value $\theta_1$ in Θ be denoted by $S_{\theta_1}$. Then the training data set is $S = \cup_{\theta \in \Theta} S_\theta$ and the training criterion (17) can be written as $$Q(W) = \sum_{\theta \in \Theta} \sum_{\omega \in S_\theta} Q_\omega$$

$$Q_\omega := \frac{1}{T(\#S)} \sum_{\tau=1}^{T} \rho(\tau, \omega, \gamma(\tau, \omega, W)),$$

where #S is the number of elements in $S = \cup_{\theta \in \Theta} S_\theta$ as in (17). This training criterion is called an adaptation training criterion. The methods of training an NS offline discussed above are equally applicable here. The "multistream" training method reported in L. A. Feldkamp and G. V. Puskorius, "Training of robust neural controller," in *Proceedings of the 33rd Conference on Decision and Control*, pp. 2754–2759, Lake Buena Vista, Fla., 1994 is known to be effective for training a recursive neural network with respect to the above training criterion. After some modification, it is expected to be effective also for training an NS with respect to the above training criterion. An NS consisting of a recursive neural network and at least one range reducer by linear prediction and/or range extender by linear prediction, that is synthesized with respect to the above training criterion, has adaptive ability to adapt to the environmental parameter θ.

Training a Neural System Online

In many applications, training a neural system (NS) is performed online. The training data used in training a neural system (NS) online are usually the current realizations collected online of the processes defining the performance criterion during the operation of the NS. Therefore, these current realizations usually start at time 1 and ends at the current time t. If we still use ω to denote a realization of the operating environment from time 0 to time t and still use S to denote the set of such current realizations of the operating environment available online for training the NS online, a training criterion here is written as $$Q(W, t) = \frac{1-\lambda}{(1-\lambda^t)(\#S)} \sum_{\omega \in S} \sum_{\tau=1}^{t} \lambda^{t-\tau} \rho(\tau, \omega, \gamma(\tau, \omega, W)), \quad (19)$$

where λ is a discount factor from the interval [0, 1]. Notice that in most cases, the set S contains only one current realization of the operating environment and the above training criterion becomes $$Q(W, t) = \frac{1-\lambda}{1-\lambda^t} \sum_{\tau=1}^{t} \lambda^{t-\tau} \rho(\tau, \omega, \gamma(\tau, \omega, W)). \quad (20)$$

A training criterion that is used for training an NS online, such as (19) and (20), is called an online training criterion.

For training an NS online, RTRL is more suitable than BPTT for evaluating derivatives for Q(W), and the gradient descent and EKF methods are more suitable than conjugate gradient and quasi-Newton methods for minimizing Q(W) given its derivatives. The combination of RTRL and Puskorius and Feldkamp's EKF method is preferred. The combination works better than the combination of RTRL and the basic gradient descent method.

Conclusion, Ramification, and Scope of Invention

There are many difficulties in using a neural network to process an exogenous input process to produce a good outward output process with respect to a performance criterion in such applications as system identification/control, signal/speech processing, communication, target tracking, ship/aircraft navigation, geophysics, financial market forecasting, time-series prediction, sonar/radar data processing, economics, robotics, etc., when the range exogenous input process or outward output process is necessarily large and/or necessarily keeps growing during the operation of the neural network. These difficulties include large numbers of neurons and connections required of the neural network, large amounts of training data and computation required for training said neural network, and poor generalization capability of the trained neural network beyond the length of time for which the training data are available.

A neural system is herein disclosed that eliminates or greatly reduces these difficulties. The neural system comprises a recurrent neural network and at least one range reducer or range extender. The range reducers and extenders in accordance with the teachings of the present invention dynamically transform the exogenous input process and outward output process respectively. A neural system with at least one range reducer by estimate subtraction or range extender by estimate addition is herein disclosed as a preferred embodiment of the present invention.

While our description hereinabove contains many specificities, these should not be construed as limitations on the scope of the invention, but rather as an exemplification of preferred embodiments. In addition to these embodiments, those skilled in the art will recognize that other embodiments are possible within the teachings of the present invention. Accordingly, the scope of the present invention should be limited only by the appended claims and their appropriately construed legal equivalents.

What is claimed is:

1. A neural system for processing an exogenous input process to produce an outward output process, said neural system comprising:

a recurrent neural network; and at least one range reducer, wherein at least one weight of said recurrent neural network is a nonlinear weight determined in a training of said neural system, and wherein said range reducer is a dynamic transformer that transforms at least one component of said exogenous input process and sends at least one resultant output of said range reducer to at least one input neuron of said recurrent neural network, said at least one resultant output for a current time depending not only on a current value of said at least one component of said exogenous input process for said current time but also on at least one preceding value of said at least one component of said exogenous input process for a preceding time prior to said current time.

2. The neural system of claim 1 wherein said neural system's weights are held fixed during an operation of said neural system.

3. The neural system of claim 2 wherein said neural system's operating environment is dependent on an environmental parameter; and said neural system is trained in said training to have ability to adapt to said environmental parameter.

4. The neural system of claim 1 wherein there is at least one hidden nonlinear neuron in said recurrent neural network; and said at least one weight is a nonlinear weight local to one of said at least one hidden nonlinear neuron.

5. The neural system of claim 1 wherein said recurrent neural network is a recursive neural network; and said at least one weight is a weight in a recursive section of said recurrent neural network.

6. The neural system of claim 1 wherein one of said at least one range reducer is a range reducer by estimate subtraction.

7. The neural system of claim 1 wherein at least one weight is adjusted in an online training.

8. The neural system of claim 1 wherein one of said at least one range transformer is selected from the group consisting of range reducers by differencing and range reducers by linear prediction.

9. A neural system for processing an exogenous input process to produce an outward output process, said neural system comprising:

a recurrent neural network; and at least one range extender, wherein at least one weight of said recurrent neural network is a nonlinear weight determined in a training of said neural system, and wherein said range extender is a dynamic transformer that transforms an output from at least one output neuron of said recurrent neural network and produces at least one component of said outward output process, said at least one component for a current time depending not only on a current value of said output from said at least one output neuron for said current time but also on at least one preceding value of said output from said at least one output neuron for a preceding second time prior to said current time.

10. The neural system of claim 9 wherein said neural system's weights are held fixed during an operation of said neural system.

11. The neural system of claim 10 wherein said neural system's operating environment is dependent on an environmental parameter; and said neural system is trained in said training to have ability to adapt to said environmental parameter.

12. The neural system of claim 9 wherein there is at least one hidden nonlinear neuron in said recurrent neural network; and said at least one weight is a nonlinear weight local to one of said at least one hidden nonlinear neuron.

13. The neural system of claim 9 wherein said recurrent neural network is a recursive neural network; and said at least one weight is a weight in a recursive section of said recurrent neural network.

14. The neural system of claim 9 wherein one of said at least one range extender is a range extender by estimate addition.

15. The neural system of claim 9 wherein at least one weight is adjusted in an online training.

16. The neural system of claim 9 wherein one of said at least one range extender is selected from the group consisting of range extenders by accumulation, range extenders by linear prediction, and range extenders by feedforward linear estimation.

17. An article of manufacture for training a neural system for processing an exogenous input process to produce an outward output process, said neural system comprising a recurrent neural network and at least one dynamic range transformer, wherein at least one weight of said recurrent neural network is a nonlinear weight determined by said training, said article of manufacture comprising:

evaluation means for evaluating a training criterion; and adjusting means for adjusting the values of said neural system's weights to reduce the value of said training criterion, wherein an output of said range transformer depends not only on a current value of an input of said range transformer for a current time but also on a preceding value of said input of said range transformer for a preceding time prior to said current time.

18. The article of manufacture of claim 17 wherein there is at least one hidden nonlinear neuron in said recurrent neural network; said at least one weight is a nonlinear weight local to a hidden nonlinear neuron; and said at least one range transformer is at least one range extender by estimate addition.

19. The article of manufacture of claim 17 wherein there is at least one hidden nonlinear neuron in said recurrent neural network; said at least one weight is a nonlinear weight local to a hidden nonlinear neuron; and said at least one range transformer is at least one range reducer by estimate subtraction.

20. The article of manufacture of claim 17 wherein said recurrent neural network is a recursive neural network and wherein said at least one weight is a nonlinear weight in a recursive section of said recurrent neural network.

* * * * *